United States Patent
Olcen et al.

(10) Patent No.: US 7,777,595 B2
(45) Date of Patent: Aug. 17, 2010

(54) MULTI-CHANNEL FILTER ASSEMBLIES

(75) Inventors: Ahmet Burak Olcen, Syracuse, NY (US); Erdogan Alkan, Syracuse, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 157 days.

(21) Appl. No.: 12/112,320

(22) Filed: Apr. 30, 2008

(65) Prior Publication Data

US 2009/0273414 A1    Nov. 5, 2009

(51) Int. Cl.
*H01P 5/12* (2006.01)
*H03H 9/00* (2006.01)
*H03H 7/00* (2006.01)

(52) U.S. Cl. .................. 333/136; 333/100; 333/133

(58) Field of Classification Search .............. 333/101, 333/105, 133, 187, 188, 189, 186, 193, 197, 333/198, 199, 202, 207, 100
See application file for complete search history.

(56) References Cited

U.S. PATENT DOCUMENTS

| | | | |
|---|---|---|---|
| 5,839,062 A | 11/1998 | Nguyen et al. | |
| 6,204,737 B1 * | 3/2001 | Ella | 333/187 |
| 6,242,843 B1 * | 6/2001 | Pohjonen et al. | 310/313 R |
| 6,577,040 B2 | 6/2003 | Nguyen | |
| 6,680,660 B2 | 1/2004 | Nguyen | |
| 6,771,905 B1 | 8/2004 | Bortz | |
| 6,784,766 B2 | 8/2004 | Allison et al. | |
| 6,944,406 B1 | 9/2005 | Way | |
| 6,995,622 B2 | 2/2006 | Partridge et al. | |
| 2005/0095000 A1 | 5/2005 | DeCusatis et al. | |
| 2005/0206482 A1 | 9/2005 | DuToit et al. | |
| 2006/0057959 A1 | 3/2006 | Vacanti et al. | |

* cited by examiner

*Primary Examiner*—Dean O Takaoka
(74) *Attorney, Agent, or Firm*—Alston & Bird LLP

(57) ABSTRACT

A filter assembly includes an electrically conductive input member, an electrically conductive output member, and filter elements. Each filter element includes a connection disposed in an open or closed configuration, and a band filter, which may be a band-pass filter or a band-stop filter. A generic filter assembly is first manufactured having all connections in their open or closed configurations. A channel-selective filter assembly is then further manufactured by structural modification of one or more of the connections. Each connection of the channel-selective filter assembly is in its open or closed configuration independently of each other connection of each other filter element. Each frequency channel in a cable television (CATV) network, for example, is restricted or permitted by the channel-selective filter assembly.

17 Claims, 18 Drawing Sheets

MULTI-CHANNEL FILTER ASSEMBLIES

FIELD OF THE INVENTION

This invention relates generally to filters for regulating signal distribution in a multi-frequency signal network and more particularly relates to filters for permitting and blocking cable television channels.

BACKGROUND OF THE INVENTION

A typical cable television (CATV) network provides many content selections to a subscriber's media device by way of a single electrically conductive cable that provides a signal stream to the media device. Each content selection is typically conveyed by oscillatory electrical signals that propagate along the cable in a frequency range, or "channel," that is distinct from the frequency ranges of other content selections. The regulation of subscription terms toward permitting and blocking particular channels entails permitting and blocking oscillatory electrical signals according to their respective frequency ranges.

Each CATV provider may transmit in frequency channels that are different from that of other providers. Each provider may also offer various types of subscription contracts, each contract binding the provider to deliver certain channels and at least motivating the provider to block the channels that are not included in the contract terms. For example, channel blocking may restrict higher-cost content from reaching subscribers seeking access to only basic selections by payment of low subscription fees, and may prevent inappropriate material from reaching younger viewers. Thus, among the many CATV networks and their numerous subscribers, many thousands of channel-by-channel permitting and blocking configurations are desired.

Accordingly, the CATV industry calls upon the manufacturers of electronic filters to provide band-pass and band-stop filters in seemingly endless and rapidly changing varieties. Competitive pricing in the subscriptions of CATV networks, however, limits the costs in feasibly designing, fabricating, stocking, and distributing custom filters intended to meet ever-changing demands.

Thus, it would be desirable to provide generic devices that can be manufactured in bulk and then modified to meet numerous and varied filtering demands.

BRIEF SUMMARY OF THE INVENTION

The present invention addresses the above needs and enables other advantages, by providing, in one aspect of the invention, a method of making a filter assembly. In this aspect, the method includes disposing an electrically conductive input member on a substrate, disposing an electrically conductive output member on the substrate, disposing a plurality of band filters on the substrate, disposing a plurality of connections on the substrate in one-to-one correspondence with the band filters, wherein the connections are structured such that every connection is disposed in an electrically non-conductive open configuration or such that every connection is disposed in an electrically conductive closed configuration, and structurally modifying at least one of the connections from the electrically open configuration to the electrically closed configuration or from the electrically closed configuration to the electrically open configuration. At least upon structurally modifying at least one of the connections, a transmission path for oscillatory electrical signals is defined between the input member and the output member, through which transmission path oscillatory electrical signals in at least one said frequency band is attenuated or blocked from passing from the input member to the output member.

In at least one embodiment according to this aspect, the method includes structurally modifying at least one of the connections by disposing an electrical jumper across a gap defined by a particular connection such that the particular connection is structurally modified from an electrically open configuration to an electrically closed configuration. For example, an electrically conductive material can be disposed across the gap by at least one of chemical vapor deposition, sputtering, epitaxial growth, solder reflowing, and placement of an electrically conductive member.

In at least one other embodiment according to this aspect, the method includes structurally modifying at least one of the connections by removing an electrical jumper from a particular connection such that a gap is defined and the particular connection is structurally modified from an electrically closed configuration to an electrically open configuration. For example, an electrical jumper can be removed by at least one of mechanical material removal, chemical etching, ablating the jumper, burning the jumper, melting the jumper, applying radiation, applying ultraviolet radiation, applying laser radiation, applying electrical current, applying electrical voltage, and applying heat.

In another aspect of the invention, a method of modifying a filter assembly is provided. In this aspect, the method includes providing a filter assembly that includes at least a substrate, an electrically conductive input member disposed on the substrate, an electrically conductive output member disposed on the substrate, a plurality of band filters disposed on the substrate such that each band filter is structured to pass or stop oscillatory electrical signals in a respective frequency band, and a plurality of connections disposed on the substrate in one-to-one correspondence with the band filters, wherein the connections are structured such that every connection is disposed in an electrically non-conductive open configuration or such that every connection is disposed in an electrically conductive closed configuration. The method further includes structurally modifying at least one of the connections from an electrically open configuration to an electrically closed configuration or from an electrically closed configuration to an electrically open configuration. At least upon structurally modifying at least one of the connections, a transmission path for oscillatory electrical signals is defined between the input member and the output member, through which transmission path oscillatory electrical signals in at least one said frequency band is attenuated or blocked from passing from the input member to the output member.

In yet another aspect of the invention, a filter assembly is provided and includes a substrate, an electrically conductive input member disposed on the substrate, an electrically conductive output member disposed on the substrate, a plurality of band filters disposed on the substrate, wherein each band filter is structured to pass or stop oscillatory electrical signals in a respective frequency band, and a plurality of connections disposed on the substrate in one-to-one correspondence with the band filters, wherein the connections are structured such that every connection is disposed in an electrically non-conductive open configuration.

In at least one example according to this aspect, each connection is disposed on the substrate in an open configuration such that each connection electrically isolates a corresponding band filter from the input member and the output member. In another example, each band filter floats electrically with at least one of the input member and the output member.

In any embodiment of the invention, the band filters of the filter elements may be provided as surface acoustic wave (SAW) filters. Furthermore, the band filters of the filter elements may be provided as micro-electromechanical system (MEMS) filters.

BRIEF DESCRIPTION OF THE DRAWINGS

Figure 1:
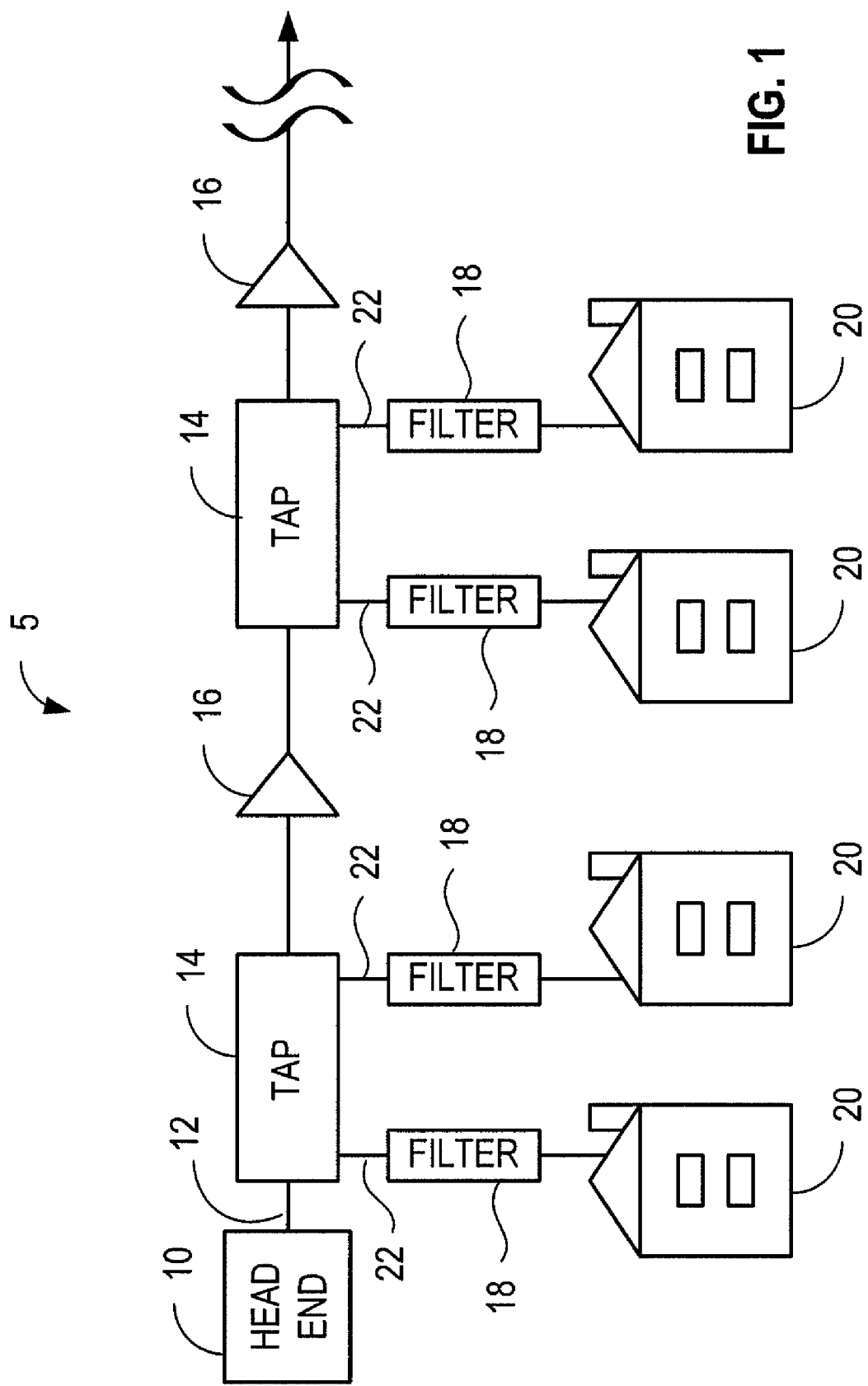
Figure 2:
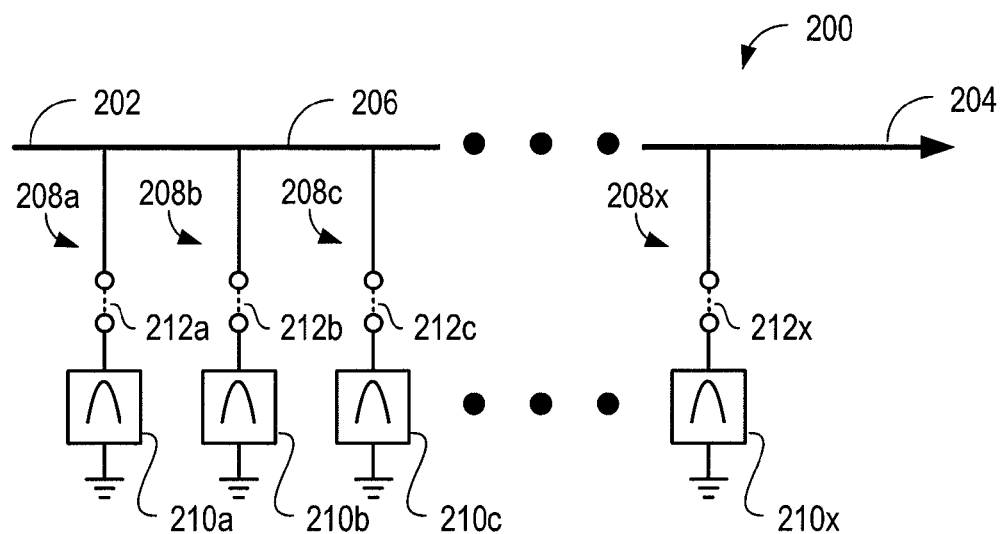
Figure 3:
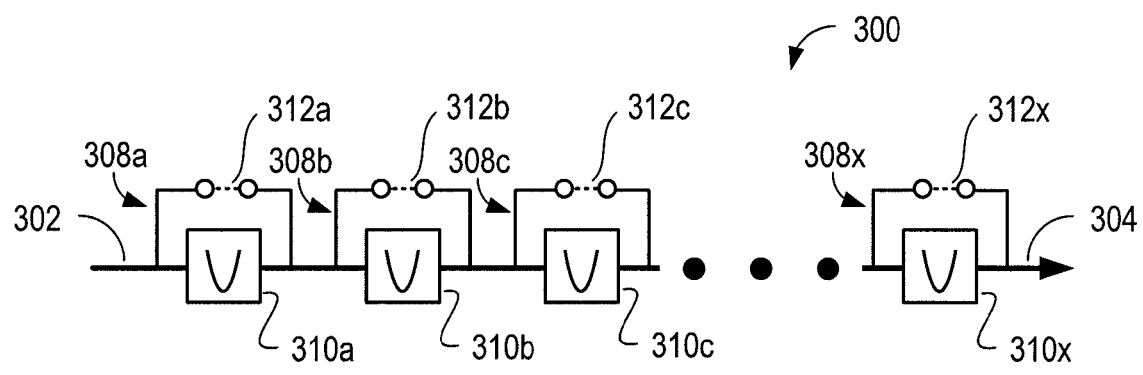
Figure 5:
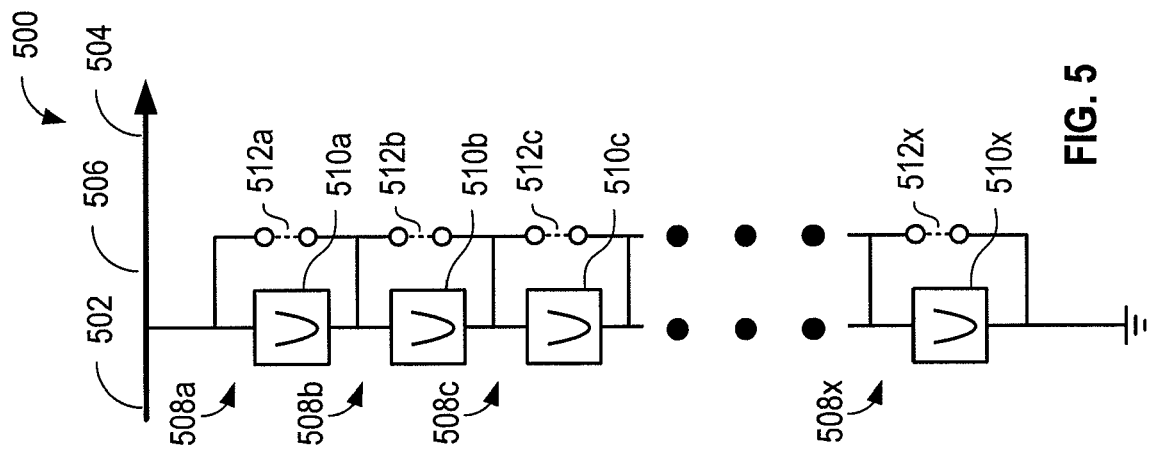
Figure 4:
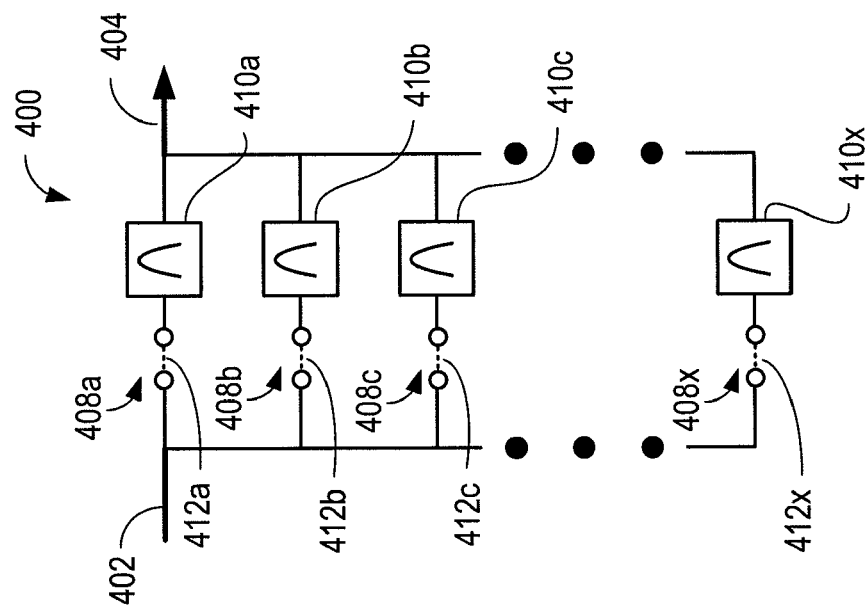
Figure 6A:
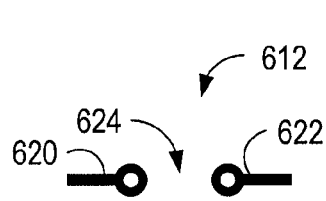
Figure 6B:
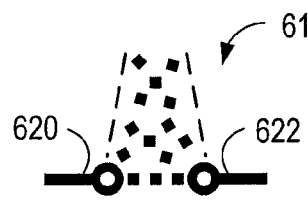
Figure 6C:
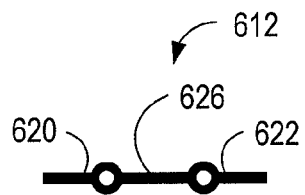
Figure 7A:
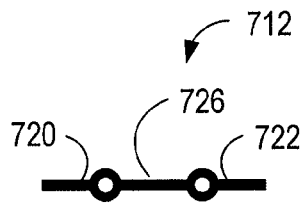
Figure 7B:
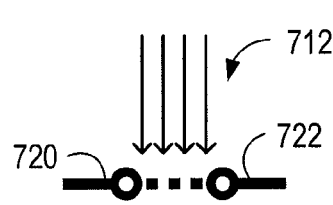
Figure 7C:
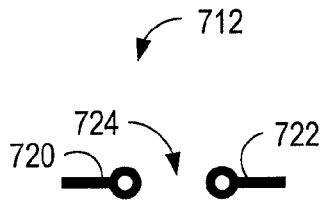
Figure 8:
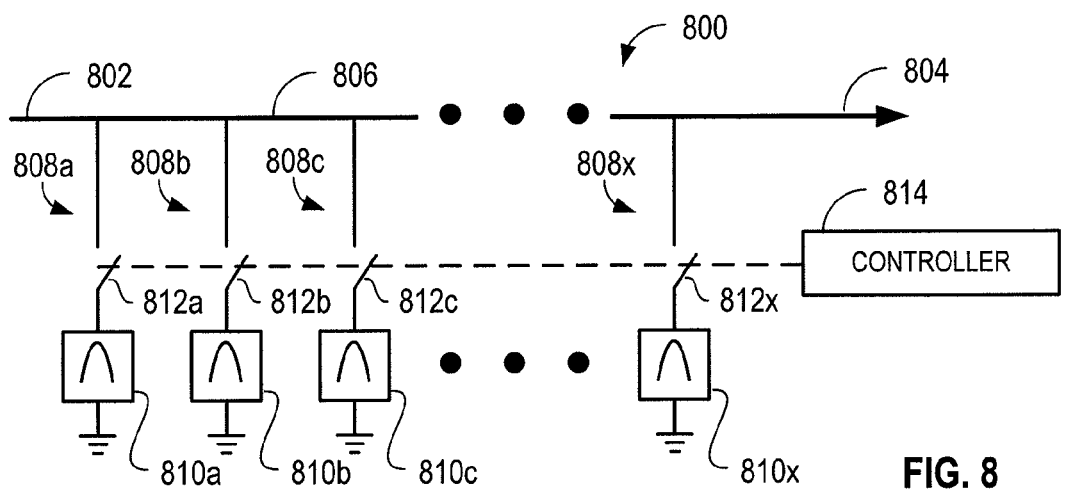

Having thus described the invention in general terms, reference will now be made to the accompanying drawings, which are not necessarily drawn to scale, and wherein:

FIG. 1 depicts a network, such as a cable television (CATV) network, in which content selections are sent downstream from a head end toward receiving systems through filter assemblies that may be constructed according to any of the embodiments of FIGS. 2-5;

FIG. 2 is a diagrammatic representation of a filter assembly according to at least one embodiment of the invention;

FIG. 3 is a diagrammatic representation of a filter assembly according to another embodiment of the invention;

FIG. 4 is a diagrammatic representation of a filter assembly according to yet another embodiment of the invention;

FIG. 5 is a diagrammatic representation of a filter assembly according to at least one other embodiment of the invention;

FIGS. 6a-6c represent at least one process by which a connection first manufactured in an open configuration is structurally modified from the open configuration to a closed configuration;

FIGS. 7a-7c represent at least one process by which a connection first manufactured in a closed configuration is structurally modified from the closed configuration to an open configuration; and FIG. 8 is a diagrammatic representation of a filter assembly according to at least one other embodiment of the invention.

Figure 21:
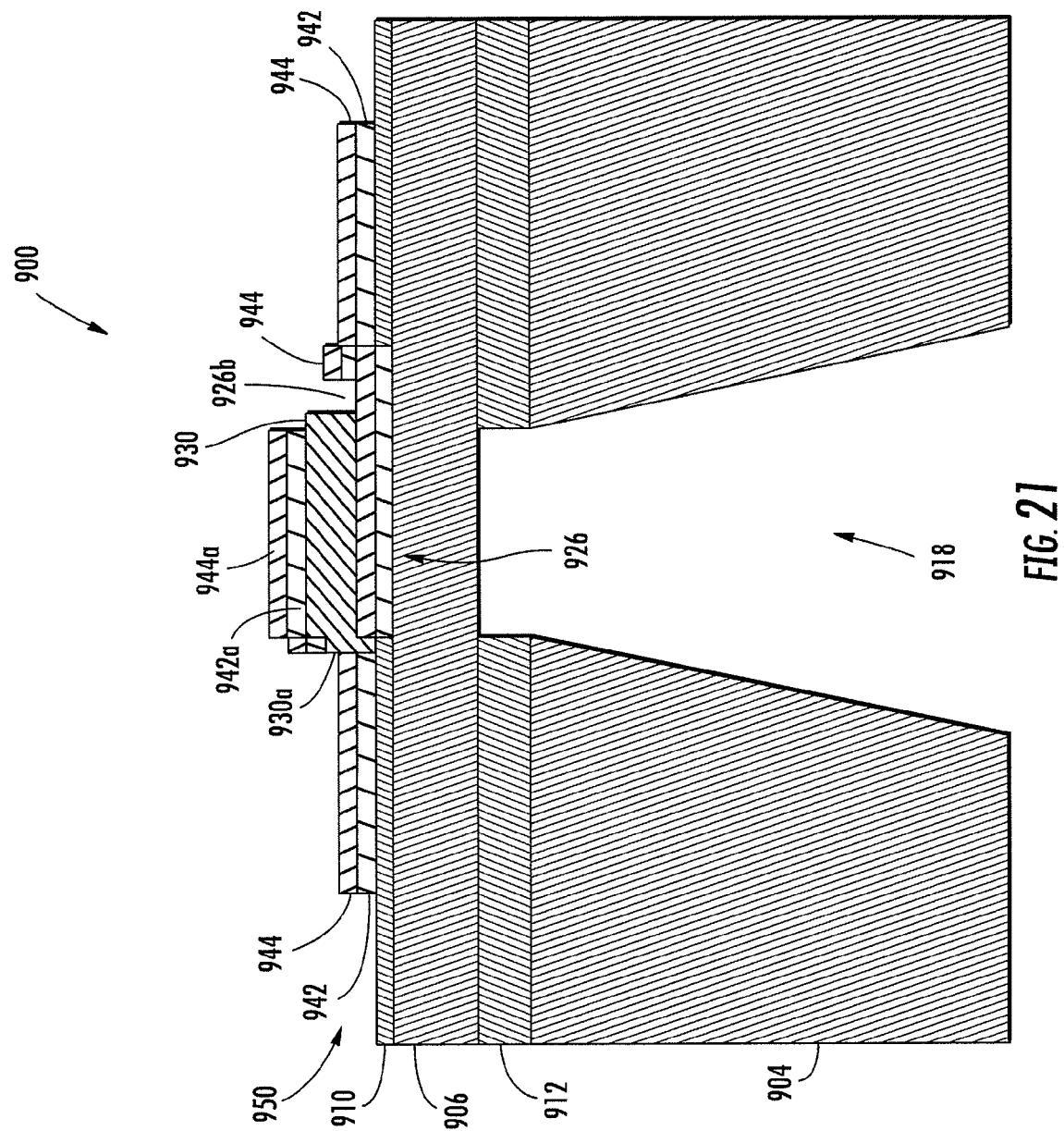
Figure 22:
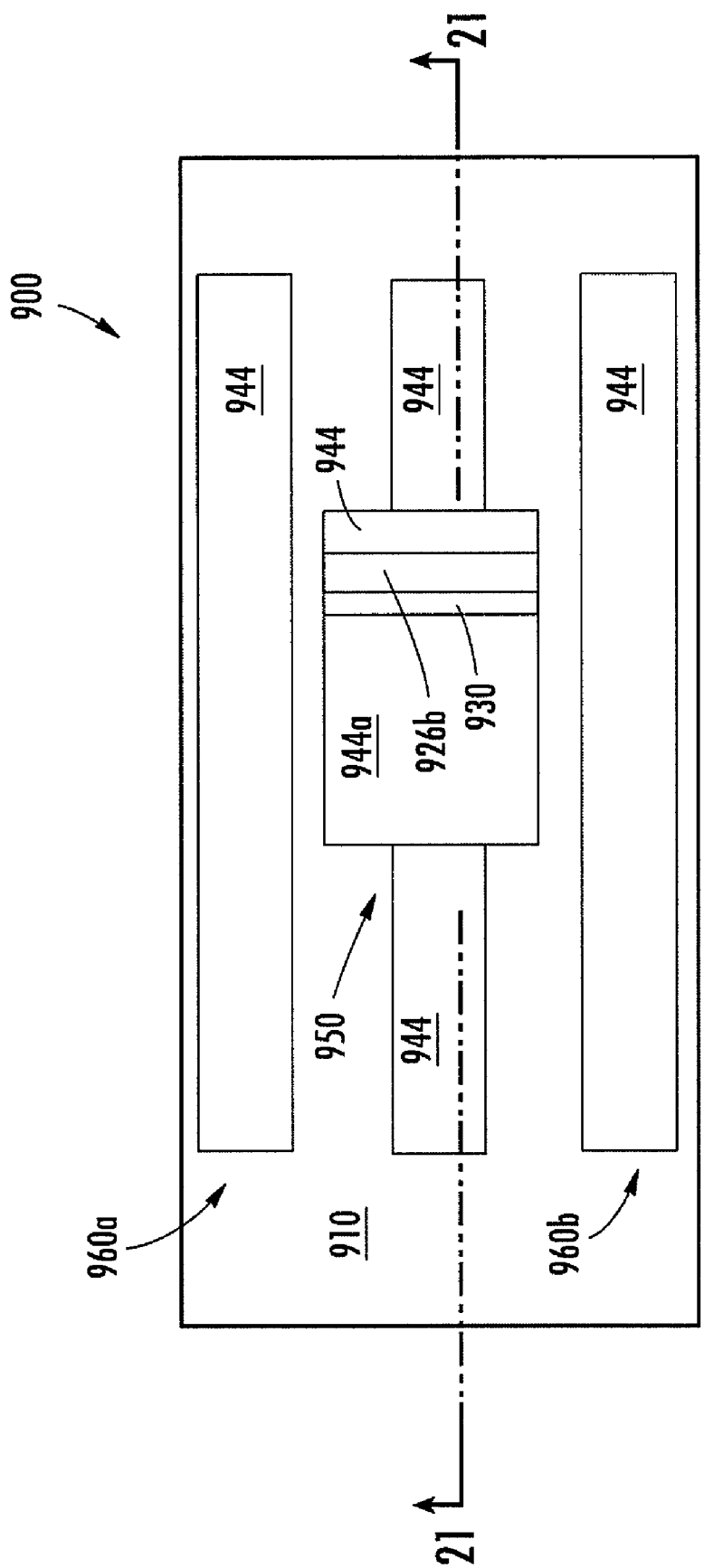

FIGS. 9-19 represent cross-sectional views of fabrication stages of a structure, leading to the tuned acoustic resonator of FIGS. 21-22.

Figure 18:
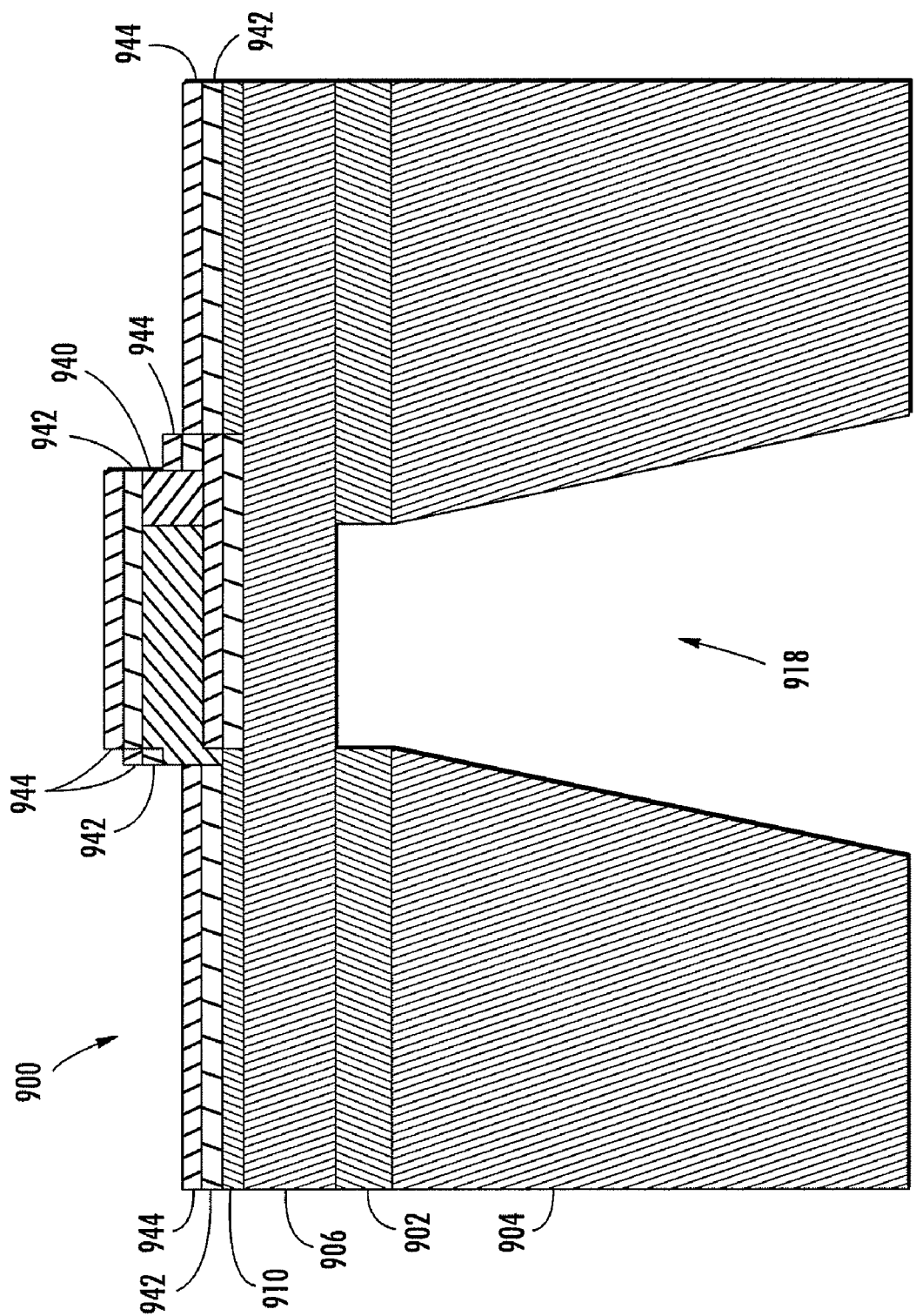
Figure 19:
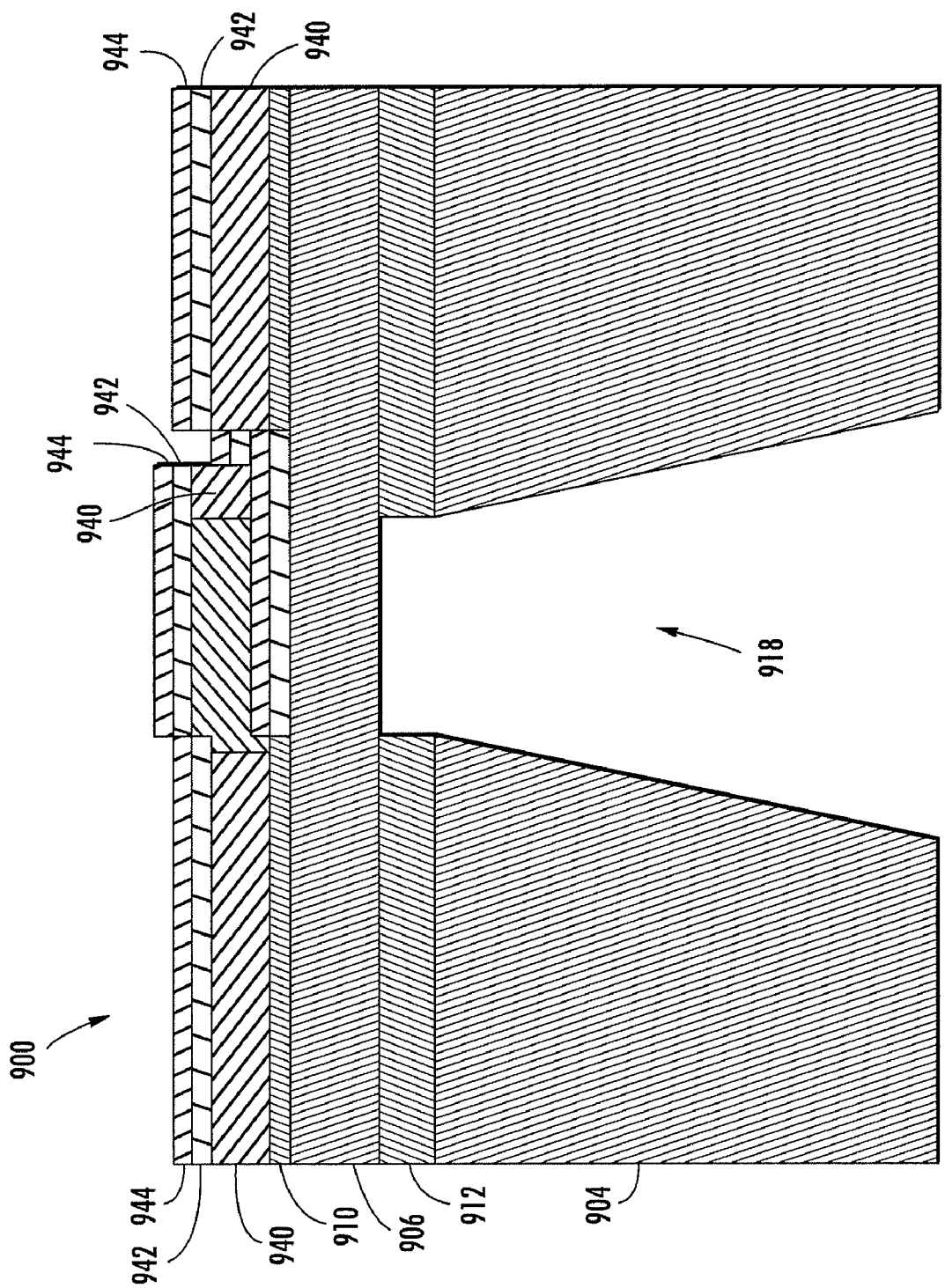
Figure 20:
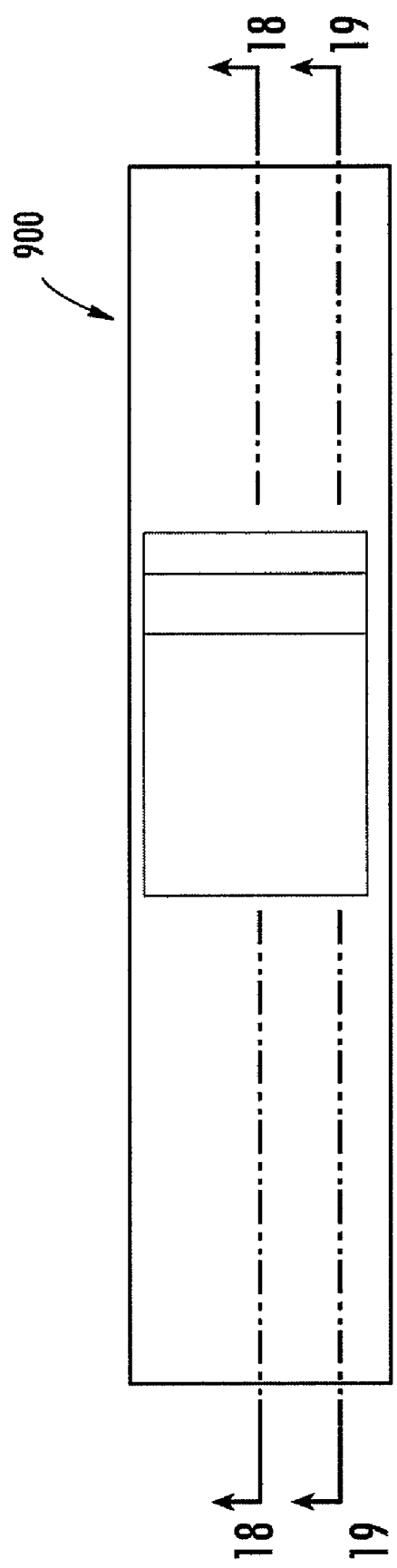

FIG. 20 represents a plan view of the structure at the fabrication stage shown in FIGS. 18-19, which are taken as indicated in FIG. 20.

FIG. 21 represents a cross-sectional view of a fabricated tuned acoustic resonator taken as indicated in the corresponding plan view of FIG. 22.

FIG. 22 is a plan view of the tuned acoustic resonator of FIG. 21.

DETAILED DESCRIPTION OF THE DRAWINGS

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

A network 5 in accordance with at least one embodiment of the invention is depicted in FIG. 1, in which a head end 10 provides multiple content selections along a main trunk 12. The content selections are destined for receipt by a number of receiving systems 20 according to the preferences, subscription terms, or relationship between the operator of the head end 10 and the respective user of each receiving system 20. In FIG. 1, the receiving systems 20 are graphically represented as residential homes or business facilities to illustrate that the operator of the head end 10 may be a cable television (CATV) service provider and the receiving systems 20 may be multimedia presentation systems providing audio and video presentations for entertainment, education, and training purposes. Thus, television programming from large network content providers, programming from local media providers, and premium content regarding sporting events and theatrical productions may all be provided along the main trunk 12 by the head end. Downstream of the head end, the receiving systems may include televisions, recording devices, sound systems, computers, and various elements of presentation systems. It should be understood, however, that while FIG. 1 appears to relate at least to a CATV network, these descriptions relate to other content distribution networks wherein content selections, each including information of any type, are sent downstream from a source toward at least one receiving system.

In FIG. 1, a number of taps 14 disposed along the main trunk 12 provide the content selections propagating along the trunk to a number of branches 22, along which the content selections propagate toward the receiving systems 20. Amplifiers 16 may be provided as needed along the main trunk in order to boost or repeat the content selections and to minimize degradation or loss of signals along the main trunk in scenarios where the main trunk extends a great distance. Thus, multiple content selections propagate along the branches 22, from the taps 14, and toward the receiving systems 20.

Each branch 22 in FIG. 1 represents a single electrically conductive medium along which multiple content selections propagate independently of each other. Each content selection is conveyed along the single medium by a respective oscillatory electrical signal residing in a respective frequency band. The frequency band of each particular oscillatory electrical signal is different from the frequency band of each other oscillatory electrical signal. Thus, the multiple content selections are conveyed by respective frequency components of a frequency multiplexed electrical signal propagating along each branch 22. In a typical CATV network, such frequency components are associated with channels, and a typical user may switch or configure a tuning system to present the content selection conveyed by any one channel. It should be understood that any particular channel may be active or inactive at any particular moment in time. Nonetheless, the network 5 of FIG. 1 is structured to distribute multiple content selections concurrently, by way of respective multiple channels each in a respective frequency band, to the receiving systems 20 without regard to whether every channel is active at any given moment in time.

A respective filter assembly 18 is disposed along each branch 22 between the tap 14 and the receiving system 20 thereof. Each filter assembly may be configured to permit the passage of content selections in particular channels while blocking other channels. Each filter assembly 18 may be independently configured with regard to each other filter assembly. Thus, content selections are made available to the receiving systems 20 according to the preferences, subscription terms, or relationship between the operator of the head end 10 and the respective user of each receiving system. In the following, several embodiments, according to which each of the filter assemblies 18 of FIG. 1 may be constructed, are described with references to FIGS. 2-5 and FIG. 8.

FIG. 2 is a diagrammatic representation of a filter assembly 200. The filter assembly includes an electrically conductive input member 202 by which electrical signals enter the assembly, an electrically conductive output member 204 by which electrical signals may be permitted to pass from the assembly according to the configuration of the assembly, an electrically conductive transmission member 206 through which the input member is in electrical communication with the output member, and a plurality of filter elements 208*a*-208*x*. Each filter element 208*a*-208*x* includes a respective band filter 210*a*-210*x* and a respective connection 212*a*-212*x* in series electrical communication with the band filter. Each band filter is structured to pass oscillatory electrical signals in a respective frequency band. That is, each particular band filter 210*a*-210*x* is a band-pass filter structured to pass oscillatory electrical signals in a particular frequency band and to stop oscillatory electrical signals outside of that frequency band. The respective frequency band of each band-pass filter is different from the frequency band of each other band-pass filter. Each connection 212*a* can be disposed in either an electrically non-conductive open configuration or in an electrically conductive closed configuration. Thus, each band-pass filter 210*a*-210*x* can be disposed into electrical communication with the transmission member 206 according to the configuration of the respective connection 212*a*-212*x*. Each filter element 208*a*-208*x* is electrically disposed between the transmission member 206 and a ground potential, which can correspond to local Earth ground or can correspond to a grounded, maintained, or floating electric potential, such as that of a product housing or frame, designated as ground.

In FIG. 2, when the connections 212*a*-212*x* are all in open configurations, such that each connection conducts no electrical current, a frequency multiplexed electrical signal can enter the filter assembly 200 by way of the input member 202, propagate downstream along the transmission member 206, and pass from the assembly by way of the output member 204. In the context of a multi-channel CATV transmission in the network of FIG. 1, this corresponds to permitting all channels propagating from a tap 14 to reach a receiving system 20. In this scenario, the user of the receiving system can enjoy any content selection available from the tap. In FIG. 2, this can be understood by considering that all frequencies provided at the input member are passed along the transmission member and are then available in the transmission presented at the output member, unaffected by the filter elements 208*a*-208*x*. When the connections 212*a*-212*x* are all in open configurations, each connection electrically isolates a corresponding band filter 210*a*-210*x* from the input member 202 and the output member 204. As such, the filter assembly 200 does not block any channels from reaching a subscriber in a CATV network. Such a filter assembly is useful, however, as a generic stock component from which a channel-selective filter assembly can be further manufactured by structural modification of one or more of the connections 212*a*-212*x*.

When the connection 212*a*-212*x* of any particular filter element 208*a*-208*x* is disposed in a closed configuration, such that the connection is capable of conducting electrical current, the particular filter element defines a shunt path that permits oscillatory electrical signals in the frequency band of the band-pass filter 210*a*-210*x* of the particular filter element to reach ground. Thus, when a particular connection 212*a*-212*x* is in a closed configuration, oscillatory electrical signals in the frequency band of the associated band-pass filter 210*a*-210*x* are attenuated from any signal stream propagating along the transmission member 206. In the context of a multi-channel CATV transmission in the network of FIG. 1, this corresponds to restricting the channel, and any presentation content thereof, in the frequency band of the particular filter element. In that scenario, the user of the receiving system is not permitted to enjoy the content selection conveyed in the restricted channel. In FIG. 2, this can be understood by considering that signal energy in the restricted frequency is drained from the transmission member such that any signal received at the input member in the frequency band of the affected band-pass filter is attenuated or omitted from the transmission presented at the output member. As any or all of the connections 212*a*-212*x* can be disposed in closed configurations, any or all channels can be restricted by the filter assembly 200. Similarly, as any or all of the connections 212*a*-212*x* can be disposed in open configurations, any or all channels can be permitted by the filter assembly 200.

It should be understood that while the connections 212*a*-212*x* are illustrated as disposed upstream from their respective band filters 210*a*-210*x*, a similar filter assembly includes connections disposed downstream of their band filters. Whether disposed upstream or downstream of its band filter, each connection uniquely determines whether a channel selection in the frequency of its band filter is shunted to ground and is therefore blocked or attenuated from flowing downstream from the input member to the output member. In the similar filter assembly, when the connections are all in open configurations, each band filter floats electrically with the input member, the output member, and the transmission member therebetween. As such, the similar filter assembly does not block or attenuate any channels from reaching a subscriber in a CATV network. Such a filter assembly is useful, however, as a generic stock component from which a filter assembly that blocks or attenuates selected channels can be further manufactured by structural modification of one or more of the connections.

The respective frequency band of each band-pass filter 210*a*-210*x* is different from the frequency band of each other band-pass filter. Thus, each particular filter element 208*a*-208*x* uniquely affects, according to the configuration of its respective connection 212*a*-212*x*, whether content in the frequency band of its respective band-pass filter 210*a*-210*x* is permitted to reach the output member 204 without adverse attenuation. Though four filter elements are expressly illustrated in FIG. 2, it should be understood that FIG. 2 and these descriptions relate to filter assemblies having any plural number of filter elements. For example, filter assemblies within the scope of these descriptions may have as few as two filter elements, may have approximately one hundred and fifty filter elements respectively dedicated to the channels in a CATV network, and may have more than one hundred and fifty filter elements. In other examples represented as well by FIG. 2, the respective frequency band of any particular band filter may overlap with that of any other band filter. In a particular example, the frequency band of the band-pass filter 210*a* contains several CATV channel frequencies, each of which is also contained in the frequency band of one of the other band-pass filters 210*b*-210*x*. In that particular example, the band-pass filter 210*a* is available for use in a scenario where several commonly blocked channels are to be blocked from reaching a subscriber, and, other band-pass filters 210*b*-210*x* are available for use in other scenarios where only particular ones of those channels are to be blocked. In these other examples, each band-pass filter in FIG. 2 may be dedicated to one or more CATV channels, and any one CATV channel or range of channels may be affected by any one of several band-pass filters 210*a*-210*x*. Thus, FIGS. 2-5 and 8, and these descriptions thereof, relate to filter assemblies without limitations toward the frequency bands of the band-pass and band-stop filters, and without limitations toward whether the filter assemblies are deployed for use in the CATV industry. The frequency bands can be selected to meet needs in any particular use and can therefore vary from one example to the next.

FIG. 3 is a diagrammatic representation of a filter assembly 300. The filter assembly includes an electrically conductive input member 302 by which electrical signals enter the assembly, an electrically conductive output member 304 by which electrical signals may be permitted to pass from the assembly according to the configuration of the assembly, and a plurality of filter elements 308a-308x. The filter elements 308a-308x are in series electrical communication with each other such that, together, they define a transmission path between the input member and the output member. Each filter element 308a-308x includes a respective band filter 310a-310x and a respective connection 312a-312x in parallel electrical communication with the band filter. Each band filter is structured to stop oscillatory electrical signals in a respective frequency band. That is, each particular band filter 310a-310x is a band-stop filter structured to stop oscillatory electrical signals in a particular frequency band and to pass oscillatory electrical signals outside of that frequency band. The respective frequency band of each band-stop filter is different from the frequency band of each other band-stop filter.

In FIG. 3, when the connection 312a-312x of any particular filter element 308a-308x is in a closed configuration, the connection defines a by-pass path that electrically shorts the respective band-stop filter 310a-310x of the particular filter element and thereby prevents the band-stop filter from affecting the transmission of signals in its frequency band. When the connections 312a-312x are all in closed configurations, a frequency multiplexed electrical signal can enter the filter assembly 300 by way of the input member 302, propagate downstream through the connections, and pass from the filter assembly by way of the output member 304. In the context of a multi-channel CATV transmission in the network of FIG. 1, this corresponds to permitting all channels propagating from a tap 14 to reach a receiving system 20. In this scenario, the user of the receiving system can enjoy any content selection available from the tap. In FIG. 3, this can be understood by considering that signals at all frequencies provided at the input member 302 traverse each connection 312a-312x, unaffected by the band-stop filters 310a-310x, and are then available in the transmission presented at the output member 304, unaffected by the band-stop filters.

However, when the connection 312a-312x of any particular filter element 308a-308x is disposed in an open configuration, the band-stop filter of the particular filter element defines the only transmission path by which signals entering the filter assembly may traverse the particular filter element. Thus, when a particular connection 312a-312x is disposed in an open configuration, oscillatory electrical signals in the frequency band of the respective associated band-stop filter 310-310x are blocked from reaching the output member 304. In the context of a multi-channel CATV transmission in the network of FIG. 1, this corresponds to restricting the channel, and any presentation content thereof, in the frequency band of the affected filter element. In that scenario, the user of the receiving system is not permitted to enjoy the content selection conveyed in the restricted channel. As any or all of the connections 312a-312x can be disposed in open configurations, any or all channels can be restricted by the filter assembly 300. Similarly, as any or all of the connections 312a-312x can be disposed in closed configurations, any or all channels can be permitted by the filter assembly 300.

The respective frequency band of each band-stop filter 310a-310x is different from the frequency band of each other band-stop filter. Thus, each particular filter element 308a-308x uniquely affects, according to the configuration of its respective connection 312a-312x, whether content in the frequency band of its respective band-stop filter 310a-310x is permitted to reach the output member 304. Though four filter elements 308a-308x are expressly illustrated in FIG. 3, it should be understood that FIG. 3 and these descriptions relate to filter assemblies having any plural number of filter elements. In other examples represented as well by FIG. 3, the respective frequency band of any particular band filter may overlap with that of any other band filter. Thus, in these other examples, each band-stop filter in FIG. 3 may be dedicated to one or more CATV channels, and any one CATV channel or range of channels may be affected by any one of several band-stop filters 310a-310x.

FIG. 4 is a diagrammatic representation of a filter assembly 400. The filter assembly includes an electrically conductive input member 402 by which electrical signals enter the assembly, an electrically conductive output member 404 by which electrical signals may be permitted to pass from the assembly according to the configuration the assembly, and a plurality of filter elements 408a-408x. Each filter element 408a-408x is in electrical communication with the input member and the output member independently of each other filter element, and the filter elements are in parallel electrical communication with each other. Each filter element 408a-408x includes a respective band filter 410a-410x and a respective connection 412a-412x in series electrical communication with the band filter. Each band filter is structured to pass oscillatory electrical signals in a respective frequency band. That is, each particular band filter 410a-410x is a band-pass filter structured to pass oscillatory electrical signals in a particular frequency band and to stop oscillatory electrical signals outside of that frequency band. The respective frequency band of each band-pass filter is different from the frequency band of each other band-pass filter. Each band-pass filter 410a-410x can be disposed into electrical communication with the input member 402 and the output member 404 according to the configuration of the respective connection 412a-412x.

In FIG. 4, when the connections 412a-412x are all in closed configurations, a frequency multiplexed electrical signal can enter the filter assembly 400 by way of the input member 402, propagate downstream by way of the filter elements 408a-408x, and pass from the assembly by way of the output member 404. In the context of a multi-channel CATV transmission in the network of FIG. 1, this corresponds to permitting all channels propagating from a tap 14 to reach a receiving system 20. In this scenario, the user of the receiving system can enjoy any content selection available from the tap. In FIG. 4, this can be understood by considering that each frequency provided at the input member is passed from the input member to the output member by a particular band-pass filter 410a-410x, which defines a transmission path for oscillatory electrical signals in the frequency band of the band-pass filter upon closure of respective connection 412a-412x. Thus, when the connection of any particular filter element is disposed in a closed configuration, any oscillatory electrical signal provided at the input member in the frequency band of the affected band-pass filter is provided in the transmission presented at the output member.

However, when the connection 412a-412x of any particular filter element 408a-408x is disposed in an open configuration, the frequency-specific transmission path defined by the filter element is interrupted. Thus, when a particular connection 412a-412x is disposed in an open configuration, oscillatory electrical signals in the frequency band of the associated band filter are omitted from the transmission presented at the output member 404. In the context of a multi-channel CATV transmission in the network of FIG. 1, this corresponds to restricting the channel, and any presentation content thereof, in the frequency band of the particular filter element. In that scenario, the user of the receiving system is not permitted to enjoy the content selection conveyed in the restricted channel. In FIG. 4, this can be understood by considering that signals emanating from the band filters 410*a*-410*x* toward the output member 404 are summed to generate the transmission presented at the output member. Any channel restricted by an open connection from passing through its respective band-pass filter is omitted from that summation. As any or all of the connections 412*a*-412*x* can be disposed in open configurations, any or all channels can be restricted by the filter assembly 400. Similarly, as any or all of the connections 412*a*-412*x* can be disposed in closed configurations, any or all channels can be permitted by the filter assembly 400. When the connections 412*a*-412*x* are all in open configurations, each band filter 410*a*-410*x* floats electrically with the output member 404. As such, the filter assembly 400 does not permit any channels from reaching a subscriber in a CATV network. Such a filter assembly is useful, however, as a generic stock component from which a filter assembly that permits selected channels can be further manufactured by structural modification of one or more of the connections 412*a*-412*x*.

It should be understood that while the connections 412*a*-412*x* are illustrated as disposed upstream from their respective band filters 410*a*-410*x*, a similar filter assembly includes connections disposed downstream of their band filters. Whether disposed upstream or downstream of its band filter, each connection uniquely determines whether a channel selection in the frequency of its band filter passes downstream from the input member to the output member. In the similar filter assembly, when the connections are all in open configurations, each band filter floats electrically with the input member. As such, the similar filter assembly does not permit any channels to reach a subscriber in a CATV network. Such a filter assembly is useful, however, as a generic stock component from which a filter assembly that permits selected channels can be further manufactured by structural modification of one or more of the connections.

The respective frequency band of each band-pass filter 410*a*-410*x* is different from the frequency band of each other band-pass filter. Thus, each particular filter element 408*a*-408*x* uniquely affects, according to the disposition of its respective connection 412*a*-412*x*, whether content in the frequency band of its respective band-pass filter 410*a*-410*x* is permitted to reach the output member 404. Though four filter elements 408*a*-408*x* are expressly illustrated in FIG. 4, it should be understood that FIG. 4 and these descriptions relate to filter assemblies having any plural number of filter elements. In other examples represented as well by FIG. 4, the respective frequency band of any particular band filter may overlap with that of any other band filter. Thus, in these other examples, each band-pass filter in FIG. 4 may be dedicated to one or more CATV channels, and any one CATV channel or range of channels may be affected by any one of several band-pass filters 410*a*-410*x*.

FIG. 5 is a diagrammatic representation of a filter assembly 500. The filter assembly includes an electrically conductive input member 502 by which electrical signals enter the assembly, an electrically conductive output member 504 by which electrical signals may be permitted to pass from the assembly according to the configuration of the assembly, an electrically conductive transmission member 506 through which the input member is in electrical communication with the output member, and a plurality of filter elements 508*a*-508*x*. The filter elements 508*a*-508*x* are in series electrical communication with each other and together define a shunt path disposed electrically between the transmission member and a ground potential which can correspond to local Earth ground or can correspond to a grounded, maintained, or floating electric potential, such as that of a product housing or frame, designated as ground. Each filter element 508*a*-508*x* includes a respective band filter 510*a*-510*x* and a respective connection 512*a*-512*x* in parallel electrical communication with the band filter. Each band filter is structured to stop oscillatory electrical signals in a respective frequency band. That is, each particular band filter 510*a*-510*x* is a band-stop filter structured to stop oscillatory electrical signals in a particular frequency band and to pass oscillatory electrical signals outside of that frequency band. The respective frequency band of each band-stop filter is different from the frequency band of each other band-stop filter.

In FIG. 5, when the connections 512*a*-512*x* are all disposed in open configurations, a frequency multiplexed electrical signal can enter the filter assembly 500 by way of the input member 502, propagate downstream along the transmission member 506, and pass from the assembly by way of the output member 504. In the context of a multi-channel CATV transmission in the network of FIG. 1, this corresponds to permitting all channels propagating from a tap 14 to reach a receiving system 20. In this scenario, the user of the receiving system can enjoy any content selection available from the tap. In FIG. 5, this can be understood by considering that the band-stop filters 510*a*-510*x*, each having a unique frequency band, together block any signal at any given frequency from being shunted to ground. Thus, signals provided at the input member are provided in the transmission presented at the output member, unaffected by the filter elements.

However, when the connection 512*a*-512*x* of any particular filter element 508*a*-508*x* is disposed in a closed configuration, the connection defines a by-pass path that electrically shorts the respective band-stop filter 510*a*-510*x* and permits any signals present at the connection to propagate toward ground. Thus, when a particular connection 512*a*-512*x* is disposed in a closed configuration, oscillatory electrical signals in the frequency band of the associated band-stop filter are attenuated, due to frequency specific signal loss by shunting, from the signal stream propagating along the transmission member 506. In the context of a multi-channel CATV transmission in the network of FIG. 1, this corresponds to restricting the channel, and any presentation content thereof, in the frequency band of the particular filter element. In that scenario, the user of the receiving system is not permitted to enjoy the content selection conveyed in the restricted channel. As any or all of the connections 512*a*-512*x* can be disposed in closed configurations, any or all channels can be restricted by the filter assembly 500. Similarly, as any or all of the connections 512*a*-512*x* can be disposed in open configurations, any or all channels can be permitted by the filter assembly 500.

The respective frequency band of each band-stop filter 510*a*-510*x* is different from the frequency band of each other band-stop filter. Thus, each particular filter element 508*a*-508*x* uniquely affects, according to the disposition of its respective connection 512*a*-512*x*, whether content in the frequency band of its respective band-stop filter 510*a*-510*x* is attenuated or permitted to reach the output member 504. Though four filter elements 508*a*-508*x* are expressly illustrated in FIG. 5, it should be understood that FIG. 5 and these descriptions relate to filter assemblies having any plural number of filter elements. In other examples represented as well by FIG. 5, the respective frequency band of any particular band filter may overlap with that of any other band filter. Thus, in these other examples, each band-stop filter in FIG. 5 may be dedicated to one or more CATV channels, and any one CATV channel or range of channels may be affected by any one of several band-stop filters 510*a*-510*x*.

In at least one example of each, the filter assemblies 200, 300, 400, 500 and 800 of FIGS. 2-5 and FIG. 8 are fabricated by micro-electromechanical system (MEMS) fabrication technologies. In these examples, the band filters of FIGS. 2-5 and FIG. 8 are micro-electromechanical system (MEMS) devices, and the filter assemblies include a high number, such as one-hundred or more, filter elements on a single electronic chip. Such band filters, fabricated by MEMS technologies, provide for blocking and passing in nearby channel ranges. Thus, each band-pass filter and band-stop filter described herein, when constructed to serve the CATV industry, is dedicated to a particular frequency channel, having a bandwidth of 6 megahertz (MHz), somewhere in the 55-550 MHz analog channel domain or in the 550-860 MHz digital channel domain. The filter assemblies are configured according to preferences to pass and block the various channels such that, for example, any two adjacent channels in the analog and digital frequency domains can be respectively passed and blocked. Thus, thousands of combinations toward passing and blocking preferences in the channel domains of the CATV industry are facilitated by one or more examples of the filter assemblies 200, 300, 400, 500 and 800 of FIGS. 2-5 and FIG. 8.

The band filters of the filter assemblies 200, 300, 400, 500 and 800 of FIGS. 2-5 and FIG. 8 can selected from a variety of band filter types, including, but not limited to: surface acoustic wave (SAW) resonators; film bulk acoustic resonators (FBAR); bulk acoustic wave (BAW) resonators; and solidly mounted resonators (SMR).

Regarding the configurations of the connections of FIGS. 2-5, such as the connections 212a-212x of FIG. 2, FIGS. 6a-6c depict a process by which a connection of a filter element first manufactured in a non-conducting open configuration can be disposed into a conducting closed configuration. FIGS. 7a-7c depict a process by which a connection of a filter element first manufactured in a closed configuration can be disposed into an open configuration. The connection 612 represented in FIGS. 6a-6c relates to all of the connections of the filter elements of FIGS. 2-5. Similarly, the connection 712 represented in FIGS. 7a-7c relates to all of the connections of the filter elements of FIGS. 2-5.

In FIGS. 6a-6c, a connection 612 first manufactured in an open configuration is structurally modified from the open configuration to a closed configuration. In FIG. 6a, the connection 612 is depicted as first manufactured in an open configuration in which the connection is electrically non-conducting. The connection 612 includes opposing electrically conductive members 620 and 622, which are spaced from each other such that a gap 624 is defined between the members. For example, the members 620 and 622 may be disposed or formed upon a substrate that does not conduct electrical current. No electrical current is permitted to cross the gap as long as the connection 612 remains in the open configuration.

In FIG. 6b, the connection 612 is subjected to structural modification toward a closed configuration by disposing an electrical jumper across the gap 624 (FIG. 6a). For example, a connector can be disposed across the gap by disposing electrically conductive material across the gap by chemical vapor deposition, sputtering, epitaxial growth, solder reflowing, and placement of an electrically conductive member. In FIG. 6c, in which the structural modification of the connection 612 to the closed configuration is complete, the electrical jumper 626 is placed or formed between the members 620 and 622 and disposes the members into electrical communication with each other such that the connection 612 is capable of conducting electrical current across the jumper.

In FIGS. 7a-7c, a connection 712 first manufactured in a closed configuration is structurally modified from the closed configuration to an open configuration. In FIG. 7a, the connection 712 is depicted as first manufactured in a closed configuration. The connection 712 includes opposing electrically conductive members 720 and 722, which are spaced from each other, and an electrical jumper 726, which disposes the members into electrical communication with each other such that the connection 712 is capable of conducting electrical current across the jumper. For example, the members 720 and 722 and the electrical jumper 726 may be disposed or formed upon a substrate that does not conduct electrical current.

In FIG. 7b, the connection 712 is subjected to structural modification toward an open configuration by removing the electrical jumper 726 (FIG. 7a) from the connection. For example, the jumper can be removed by mechanical material removal, chemical etching, ablating the jumper, burning the jumper, melting the jumper, applying radiation such as ultraviolet radiation and laser radiation, applying electrical current, applying electrical voltage, and applying heat. In FIG. 7c, in which the structural modification of the connection 712 to an open configuration is complete, a gap 724 is defined between the members 720 and 722 such that electrical current is not permitted to propagate across the connection 712.

For efficiency in manufacturing, the filter assemblies 200, 300, 400, and 500 of FIGS. 2-5 may be first manufactured with all of their connections in non-conducting open configurations. For example, the filter assembly 200 may be first manufactured with all of the connections 212a-212x in open configurations. When the connections 212a-212x are all in open configurations, in the context of a multi-channel CATV transmission in the network of FIG. 1, all channels propagating from a tap 14 are permitted to reach a receiving system 20. If the filter assembly 200 is to block any of the channels from reaching subscribers, one or more of the connections 212a-212x could be structurally modified from an open configuration to a closed configuration, for example, as shown in FIGS. 6a-6c. It is believed that efficiency in manufacturing and stocking filter assemblies will be provided. In this example, many filter assemblies 200 may be first manufactured with all of the connections 212a-212x in open configurations, and then batches of those filter assemblies could undergo structural modifications according to FIGS. 6a-6c in order to meet particular demands toward restricting particular channel selections in the CATV industry.

On the other hand, for efficiency in manufacturing, the filter assemblies 200, 300, 400, and 500 of FIGS. 2-5 may be first manufactured with all of their connections in conducting closed configurations. For example, the filter assembly 200 may be first manufactured with all of the connections 212a-212x in closed configurations. When the connections 212a-212x are all in closed configurations, in the context of a multi-channel CATV transmission in the network of FIG. 1, all channels corresponding to frequencies of the band-pass filters 210a-210x (FIG. 2) propagating from a tap 14 are restricted from reaching a receiving system 20. If the filter assembly 200 is to permit any of the channels to reach subscribers, one or more of the connections 212a-212x could be structurally modified from a closed configuration to an open configuration, for example, as shown in FIGS. 7a-7c. It is believed that efficiency in manufacturing and stocking filter assemblies will be provided. In this example, many filter assemblies 200 may be first manufactured with all of the connections 212a-212x in closed configurations, and then batches of those filter assemblies could undergo structural modifications according to FIGS. 7a-7c in order to meet particular demands toward permitting particular channel selections in the CATV industry.

FIG. 8 is a diagrammatic representation of a filter assembly 800. The filter assembly includes an electrically conductive input member 802 by which electrical signals enter the assembly, an electrically conductive output member 804 by which electrical signals may be permitted to pass from the assembly according to the configuration of the assembly, an electrically conductive transmission member 806 through which the input member is in electrical communication with the output member, a plurality of filter elements 808a-808x, and a controller 814. Each filter element 808a-808x includes a respective band filter 810a-810x and a respective switch 812a-812x in series electrical communication with the band filter. Each band filter is structured to pass oscillatory electrical signals in a respective frequency band. That is, each particular band filter 810a-810x is a band-pass filter structured to pass oscillatory electrical signals in a particular frequency band and to stop oscillatory electrical signals outside of that frequency band. The respective frequency band of each band-pass filter is different from the frequency band of each other band-pass filter. The controller 814 is operable to open and close each switch 812a-812x of each filter element independently of each other switch of each other filter element, and thereby controls the configuration of the assembly. Thus, each band-pass filter 810a-810x can be disposed into electrical communication with the transmission member 806 according to the disposition of the respective switch 812a-812x, which is independently under the control of the controller 814. Each filter element 808a-808x is electrically disposed between the transmission member 806 and a ground potential, which can correspond to local Earth ground or can correspond to a grounded, maintained, or floating electric potential, such as that of a product housing or frame, designated as ground.

In FIG. 8, when the switches 812a-812x are all open, wherein an open switch conducts no electrical current, a frequency multiplexed electrical signal can enter the filter assembly 800 by way of the input member 802, propagate downstream along the transmission member 806, and pass from the assembly by way of the output member 804. In the context of a multi-channel CATV transmission in the network of FIG. 1, this corresponds to permitting all channels propagating from a tap 14 to reach a receiving system 20. In this scenario, the user of the receiving system can enjoy any content selection available from the tap. In FIG. 8, this can be understood by considering that all frequencies provided at the input member are passed along the transmission member and are then available in the transmission presented at the output member, unaffected by the filter elements.

However, when the controller closes the switch 812a-812x of any particular filter element 808a-808x, wherein a closed switch conducts electrical current, the filter element defines a shunt path that permits oscillatory electrical signals in the frequency band of the band-pass filter 810a-810x of the particular filter element to reach ground. Thus, when the controller closes a particular switch 812a-812x, oscillatory electrical signals in the frequency band of the associated band-pass filter are attenuated from the signal stream propagating along the transmission member. In the context of a multi-channel CATV transmission in the network of FIG. 1, this corresponds to restricting the channel, and any presentation content thereof, in the frequency band of the affected filter element. In that scenario, the user of the receiving system is not permitted to enjoy the content selection conveyed in the restricted channel. In FIG. 8, this can be understood by considering that signal energy in the restricted frequency is drained from the transmission member such that any signal received at the input member in the frequency band of the affected band-pass filter is attenuated or omitted from the transmission presented at the output member. As the controller 814 can independently close any of the switches 812a-812x, any or all channels can be restricted by the filter assembly 800. Similarly, as the controller 814 can independently open any of the switches 812a-812x, any or all channels can be permitted by the filter assembly 800.

The respective frequency band of each band-pass filter 810a-810x is different from the frequency band of each other band-pass filter. Thus, each particular filter element 808a-808x uniquely affects, according to the disposition of its respective switch 812a-812x, whether content in the frequency band of its respective band-pass filter 810a-810x is permitted to reach the output member 804 without adverse attenuation. Though four filter elements are expressly illustrated in each of FIG. 8, it should be understood that these descriptions relate to a filter assembly having any plural number of filter elements. For example, filter assemblies within the scope of these descriptions may have as few as two filter elements, may have approximately one hundred and fifty filter elements respectively dedicated to the channels in a CATV network, and may have more than one hundred and fifty filter elements. In other examples represented as well by FIG. 8, the respective frequency band of any particular band filter may overlap with that of any other band filter. Thus, in these other examples, each band-pass filter in FIG. 8 may be dedicated to one or more CATV channels, and any one CATV channel or range of channels may be affected by any one of several band-pass filters 810a-810x.

The configuration of the filter assembly 800 can be varied on demand so that content selections reaching any particular receiving system can be varied according to subscription terms that vary over time to meet a pre-determined schedule or to meet preferences changing in real time. Information regarding the fixed or varying preferences of the users of the receiving systems 20 (FIG. 1) may be directed to the operator of the head end 10 by way of upstream signals from the receiving systems to the head end in one or more reserved frequency bands or by the embedding of the information in one or more active frequency bands according to watermarking techniques. Similarly, downstream signal from the head end 10 to the receiving systems 20 may be directed to the controller 814 (FIG. 8) to affect the opening and closing of the switches 812a-812x in order to enforce subscription terms.

FIGS. 9-22 represent cross-sectional views of fabrication stages of a tuned acoustic resonator 950, which is represented in a final fabrication stage in FIGS. 21 and 22. The acoustic resonator 950 provides an example of a type of resonator that may be included in one or more of the band filters of the filter assemblies 200, 300, 400, 500 and 800 of FIGS. 2-5 and FIG. 8. It should be understood, however, that the example represented in FIGS. 21 and 22 does not limit the variety from which the band filters of the filter assemblies described herein can be selected. As FIGS. 9-22 are described in the following, reference is made to the structure 900 without ambiguity in that progressive fabrication stages are represented in the sequence of views, and the structure 900 changes with each fabrication stage. Furthermore, these descriptions of FIGS. 9-22 refer to bottom-side and top-side layers, and upper and lower surfaces, for convenience to the reader. As intuitively expected, bottom-side layers and lower surfaces will typically be found toward or facing lower page portions in the drawings, and top-side layers and upper surfaces will typically be found toward or facing upper page portions in the drawings. This convention does not relate to any real spatial orientation, and the layered structures described can be disposed in any desired orientation.

Figure 9:
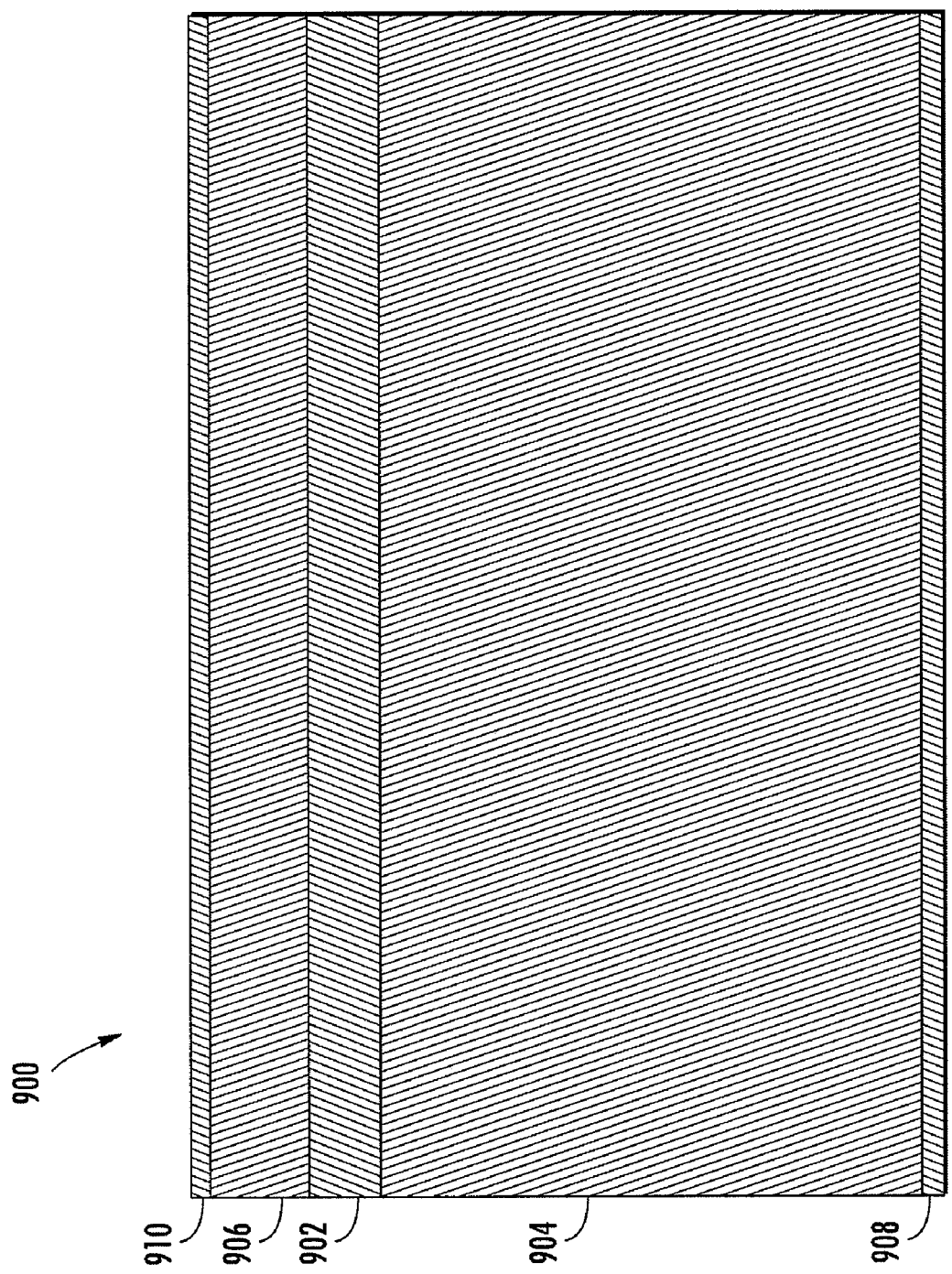
Figure 10:
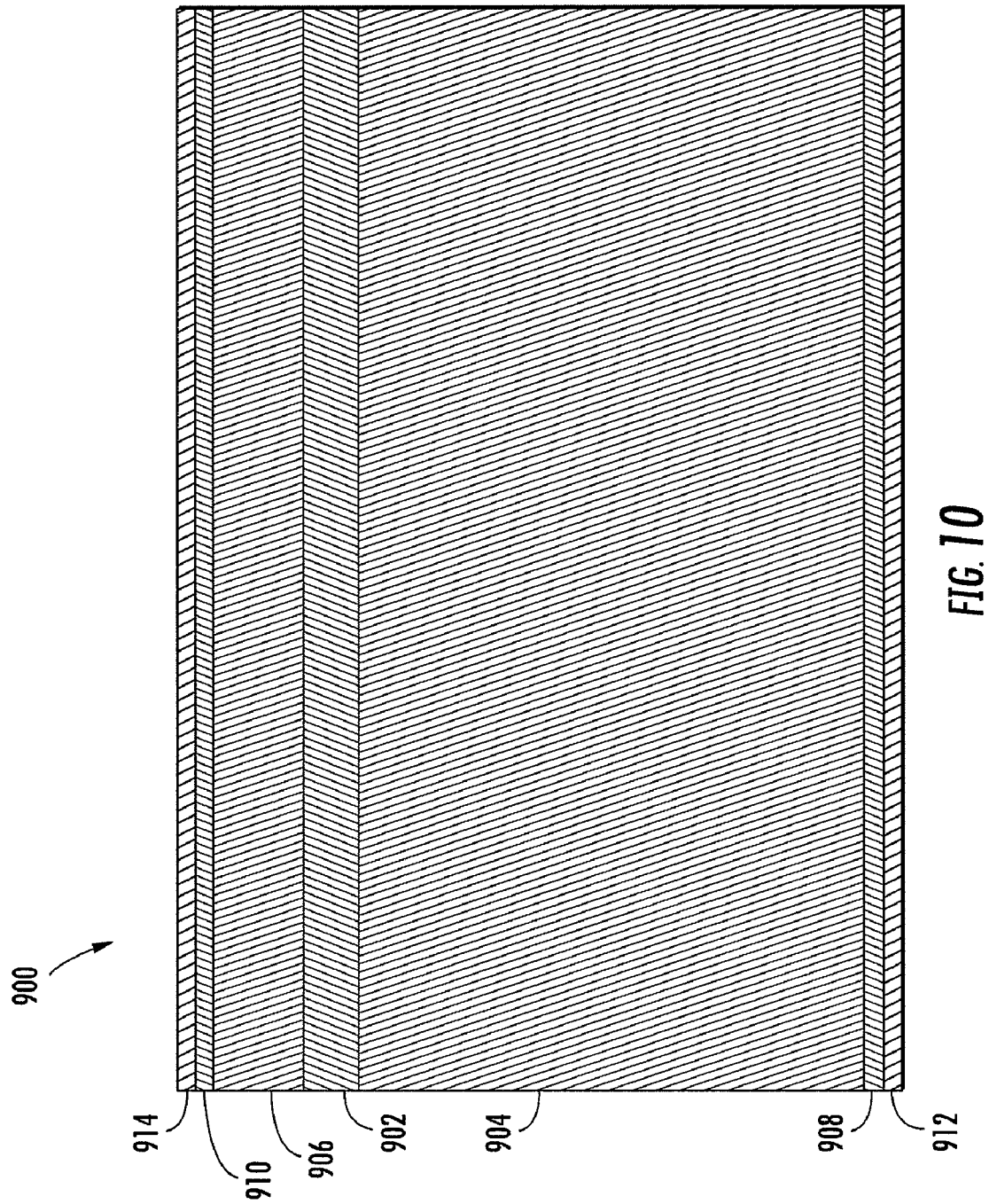

In FIG. 9, the structure 900 begins as a silicon-on-insulator wafer, which is provided as a basic substrate from which the represented fabrication stages begin. The wafer includes a buried silicon dioxide layer 902, a bottom-side silicon layer 904, and a top-side silicon layer 906. Bottom-side and top-side pad oxide layers 908 and 910 of silicon dioxide are grown on the wafer. In FIG. 10, bottom-side and top-side masking layers 912 and 914 of silicon nitride are deposited upon the pad oxide layers 908 and 910 respectively.

Figure 11:
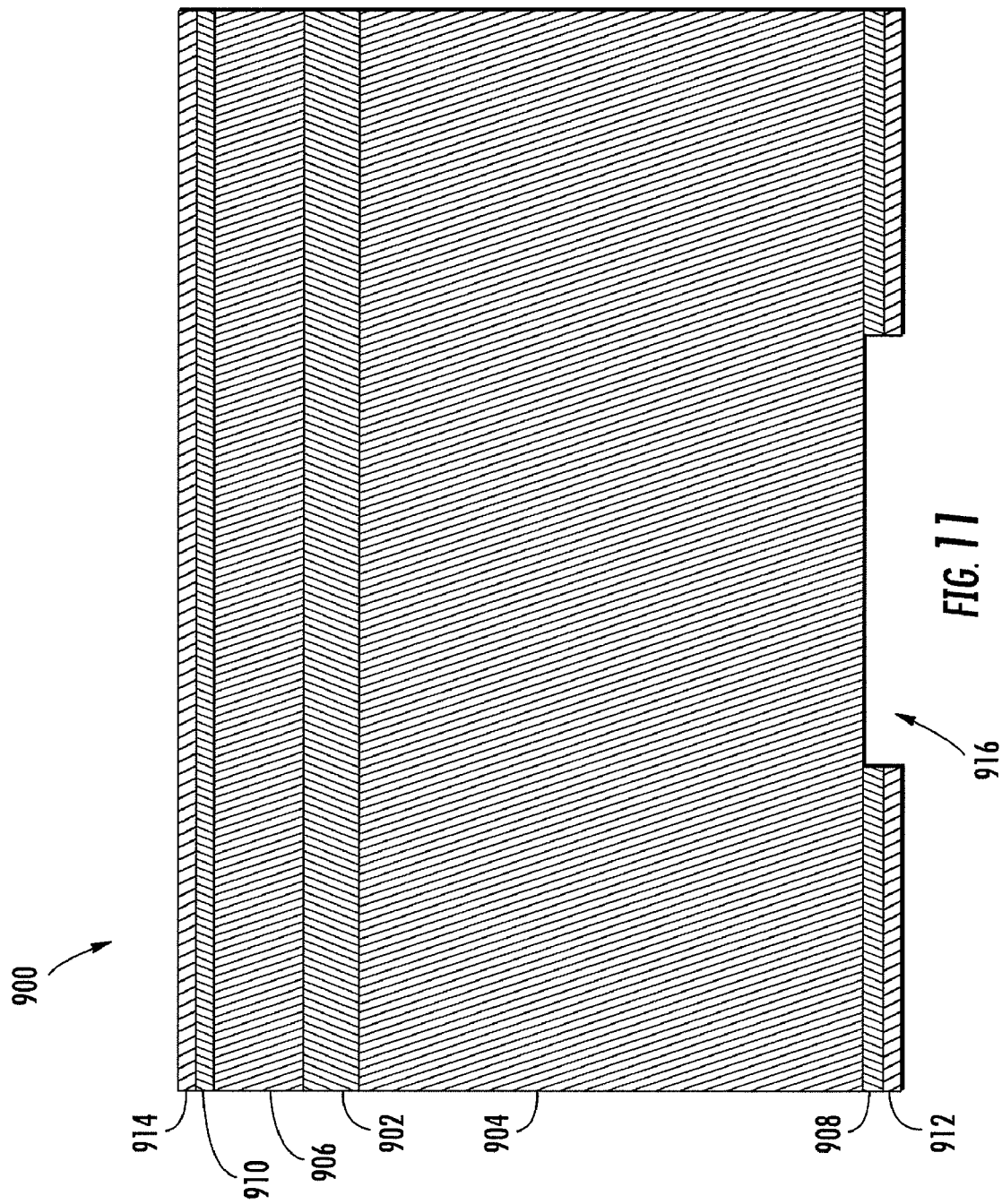
Figure 12:
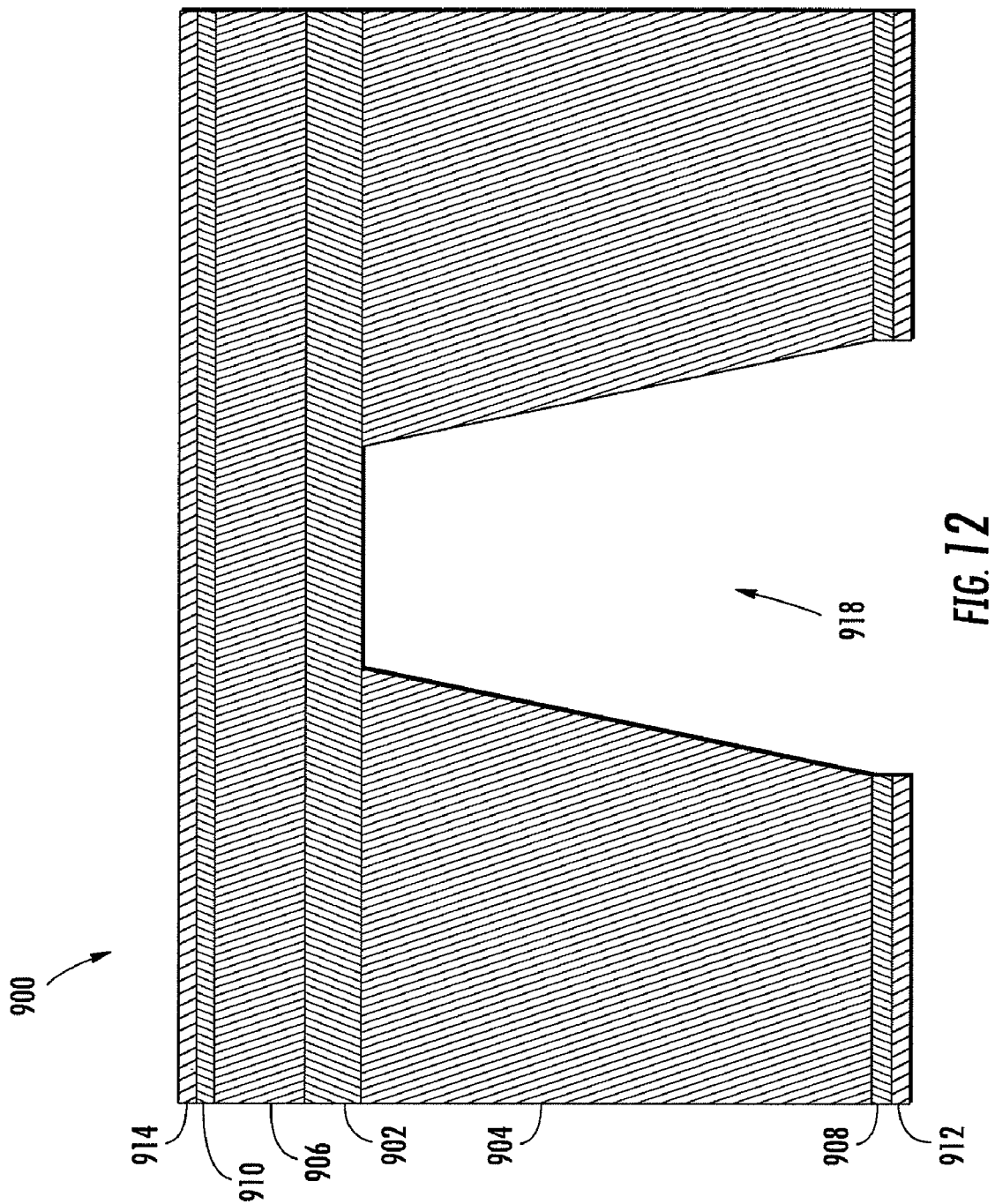
Figure 13:
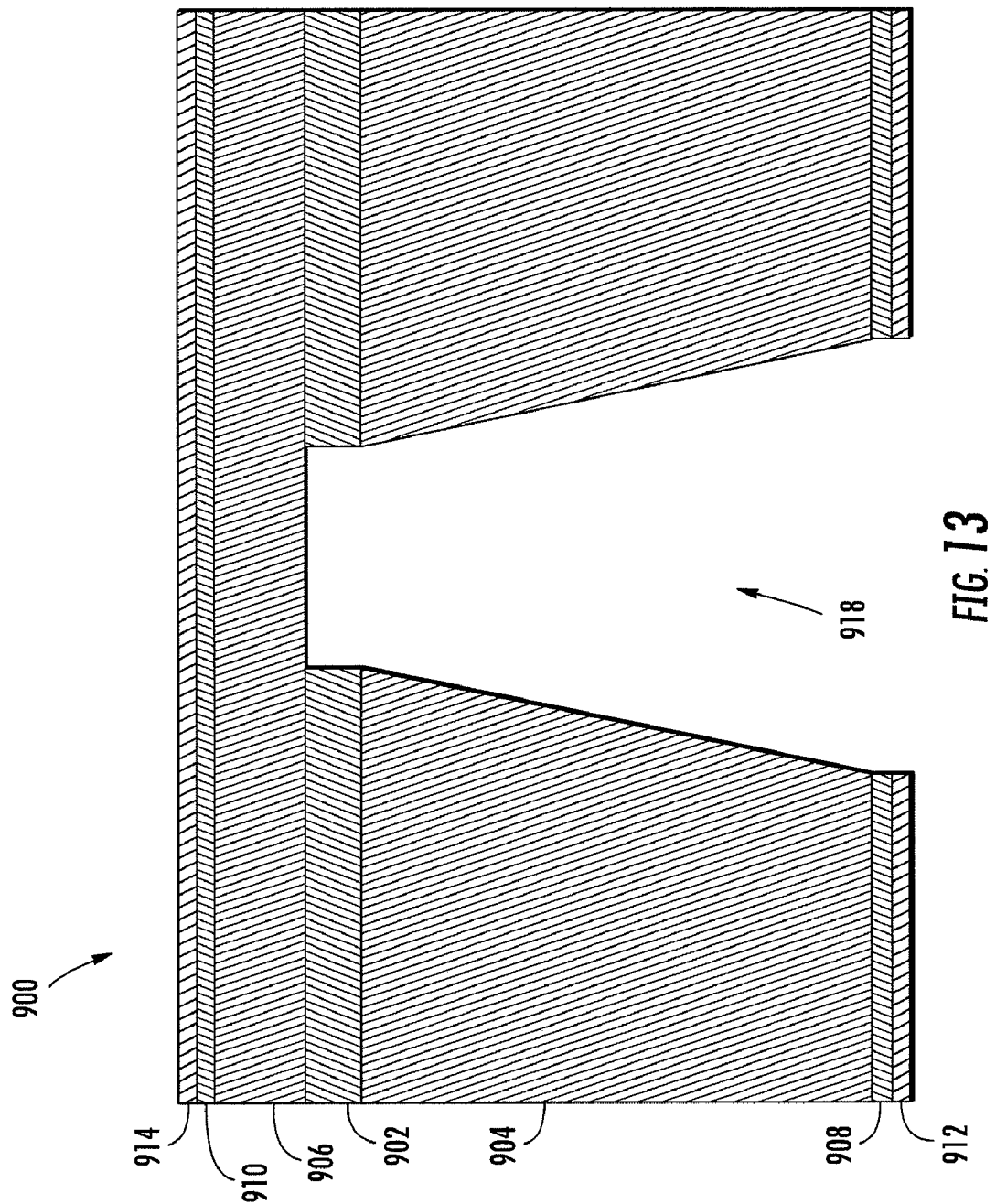

In FIG. 11, a mask opening is patterned through the bottom-side masking layer 912, and, through the mask opening, an aperture 916 is etched through the bottom-side pad oxide layer 908, exposing the lower surface the bottom-side silicon layer 904 for deep etching through the aperture 916. In FIG. 12, an anisotropic etchant is used to form a cavity 918 in the bottom-side silicon layer 904. The cavity reaches the buried silicon dioxide layer 902. In FIG. 13, the buried silicon dioxide layer 902 is removed, deepening the cavity 918 and exposing the lower surface of the top-side silicon layer 906. The fabrication stages thus far produce a top-side silicon layer 906, which has a very accurate thickness and over which a piezoelectric layer is to be fabricated for launching acoustic waves into the silicon layer 906 to define a silicon bulk acoustic resonator.

Figure 14:
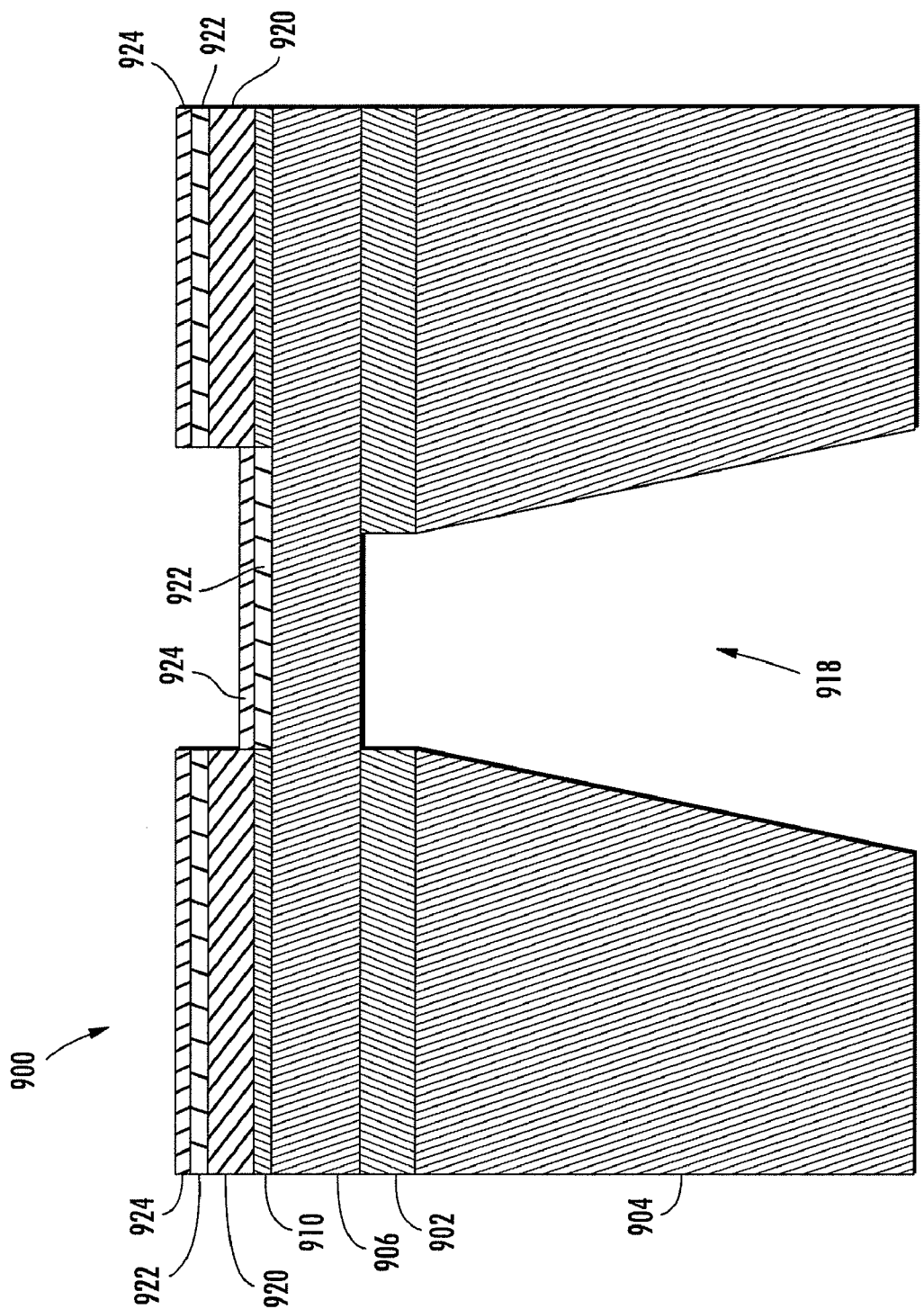

In reaching the structure 900 of FIG. 14 from that of FIG. 13, the bottom-side and top-side masking layers 912 and 914 are removed exposing the bottom-side and top-side pad oxide layers 908 and 910. A photo-resist layer 920 is patterned onto the top-side pad oxide layer 910. This is accomplished by generally applying the photo-resist to the upper face of the structure 900, and removing patterned areas of the photo-resist by lithography methods, in which light passed through a patterned mask strikes and degrades the photo-resist layer. In this example, the patterned photo-resist layer 920 leaves exposed an area of the pad oxide layer 910 above the acoustic resonant cavity 918, and covers the layer 910 beyond that area. The exposed area of the layer 910 extends laterally beyond the upper portion of the cavity 918 to provide for the eventual fabrication of electrical contacts as described in the following. The remaining bottom-side pad-oxide layer 908 and the exposed area of the top-side pad-oxide layer 910 are then removed by a buffered oxide etch. This exposes the lower surface of the bottom-side silicon layer 904 beyond the mouth of the cavity 918 and exposes the upper surface of the top-side silicon layer 906 in an area above and extending somewhat laterally beyond the upper portion of the cavity 918. A chrome layer 922 and a gold layer 924 are sequentially evaporated onto the upper surface of the structure 900. At this stage, as shown in FIG. 14, the chrome and gold layers are disposed above the photo-resist layer 920, and upon the upper surface top-side silicon layer 906 in an area above and extending somewhat laterally beyond the upper portion of the cavity 918.

Figure 15:
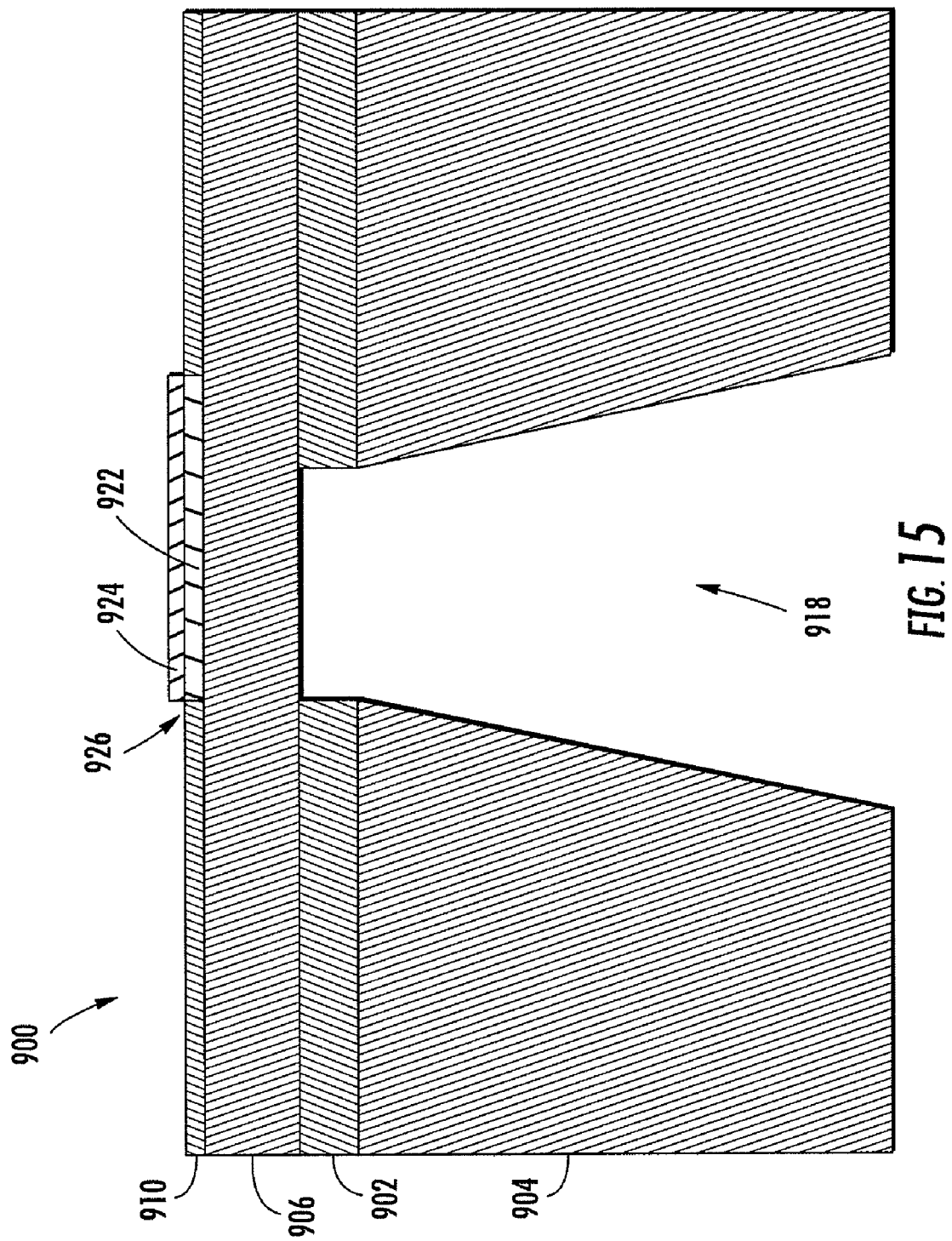

In a process that can be called lift-off, a stripping solution then strips away the photo-resist layer 920, and the chrome and gold layers lying on the photo-resist layer are carried away with the removal of the photo-resist layer. At this stage, as shown in FIG. 15, the chrome and gold layers 922 and 924 define an electrode 926 above and extending somewhat laterally beyond the upper portion of the cavity 918. The top-side pad oxide layer 910 of silicon dioxide remains on the upper surface of the silicon layer 906 beyond the area of the electrode 926.

Figure 16:
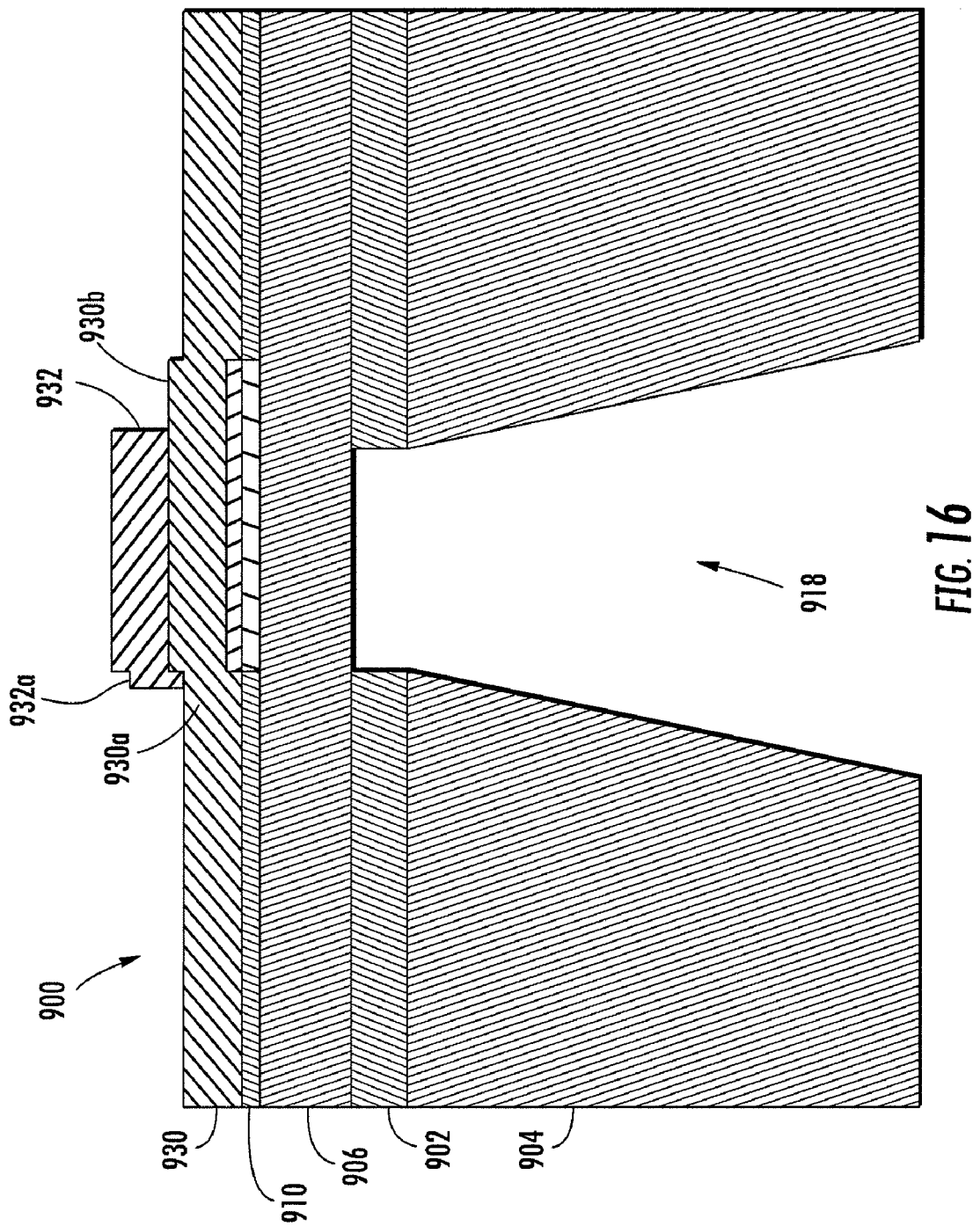

A piezoelectric layer 930 (FIG. 16) of zinc oxide is then deposited onto the top side of the entire structure 900, the layer 930 burying the electrode 926 (FIG. 15) and covering the top-side pad oxide layer 910. A photo-resist layer 932 is patterned onto the piezoelectric layer 930 above the electrode 926. As shown in FIG. 16, a side portion 932a of the photo-resist layer 932 is disposed over and protects a portion 930a of the piezoelectric layer 930 along an edge of the buried electrode while the upper surface of another portion 930b of the piezoelectric layer 930, above an opposing edge of the electrode, is exposed and unprotected like other areas of the layer 930 beyond the electrode. In reaching the structure 900 of FIG. 17 from that of FIG. 16, areas of the piezoelectric layer 930 unprotected by the photo-resist layer 932 are etched away, and upon subsequent lift-off of the photo-resist layer, the piezoelectric layer 930 remains generally above the buried electrode 926, with one edge 926a of the electrode insulated by the portion 930a, which was protected from etching by the side portion 932a of the photo-resist layer 932 (FIG. 16). The opposing edge 926b of the electrode, and the remaining areas of the silicon dioxide pad oxide layer 910 are exposed.

Figure 17:
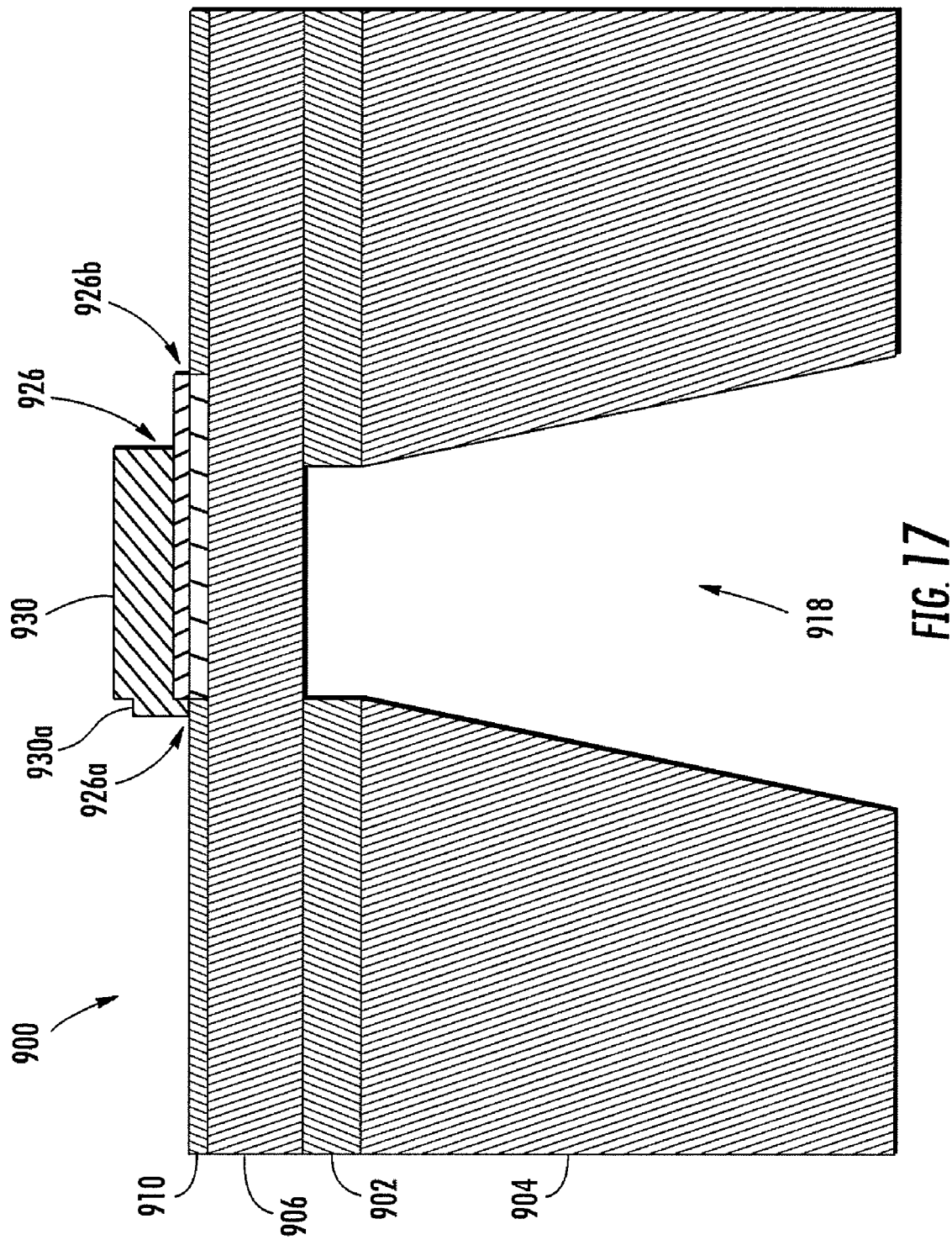

FIGS. 18 and 19 are cross-sectional views of the structure 900 at a fabrication stage following that represented in FIG. 17. The views of FIGS. 18-19 are taken as indicated in the corresponding plan view of FIG. 20. Following FIG. 17, another photo-resist layer 940 is selectively patterned over the structure 900, followed by general deposition of chrome and gold layers 942 and 944, respectively. FIG. 18 is a cross-sectional view taken where portions of the chrome and gold layers 942 and 944 are ultimately to remain as electrodes, and thus are disposed upon the top-side pad oxide layer 910. FIG. 19 is a cross sectional view taken where portions of the patterned photo-resist layer 940 are disposed between the top-side pad oxide layer 910 and the chrome layer 942. Upon lift-off of the photo-resist layer 940, those portions of the chrome and gold layers 942 and 944 above the photo-resist layer 940 in FIG. 19 will be removed. After such lift-off, the remaining structure 900 is represented in a cross-sectional view in FIG. 21, which is taken as indicated in the corresponding plan view of FIG. 22.

In FIGS. 21 and 22, the fabricated structure 900 defines a tuned acoustic resonator 950. The piezoelectric layer 930 is spaced from the top-side silicon layer 906 by the buried electrode 926. The top-side silicon layer 906 has a very accurate thickness and defines a tuned acoustic cavity. Floating portions 942a and 944a of the chrome and gold layers 942 and 944 are disposed upon the piezoelectric layer 930 opposite the buried electrode 926. One edge of the buried electrode 926 is maintained from contacting the chrome and gold layers 942 and 944 by the portion 930a of the piezoelectric layer 930, while an opposing edge 926b contacts the chrome and gold layers 942 and 944. In the illustrated arrangement, the chrome and gold layers 942 and 944, the piezoelectric layer 930 and the buried electrode 926 together define a transmission path.

A waveguide configuration is defined by the disposition of the resonator 950 between electrodes 960a and 960b (FIG. 22), which were fabricated without previous direct description as chrome and gold layers 942 and 944 were deposited and portions of these layers surrounding the electrodes 960a and 960b were removed with the lift-off of photo-resist layer 940 (FIG. 19). The electrodes 960a and 960b reside respectively in the background and foreground of the cross-section view of resonator 950 and therefore are not illustrated in FIG. 21. The electrodes 960a and 960b are analogous to the typically cylindrical, and often woven, grounded shield disposed about the central signal-carrying wire of a coaxial transmission cable. In passing electrical signals through the structure 900 represented in FIGS. 21 and 22, the electrodes 960a and 960b define ground plates as signals are injected into the resonator 950, which defines a transmission path.

The thickness of the silicon layer 906 is selected to provide tuned resonance at a preferred frequency according to the needed performance for frequency dependent passing and blocking characteristics of a frequency-selective band filter. The desired thickness can be provided at high accuracy, for example as described above with reference to FIG. 13 and the formation of the cavity 918. As signals are injected into the resonator 950, the piezoelectric layer 930 (FIG. 21) launches acoustic waves into the silicon layer 906 to define a tuned silicon bulk acoustic resonator. The cavity 918 is fabricated with generally planar walls, and is generally approximately square in its portion adjacent the silicon layer 906, the approximately square portion aligned and oriented with the piezoelectric layer 930, which is approximately square as can be deduced from the plan view of the resonator 950 in FIG. 22.

FIGS. 21 and 22 illustrate an acoustic resonator 950 and provide merely an example of a type of resonator that may be included in one or more of the band filters of the filter assemblies 200, 300, 400, 500 and 800 of FIGS. 2-5 and FIG. 8. This example does not limit the variety from which the band filters of the filter assemblies described herein can be selected and does not limit the scope of any term appearing in these descriptions or appearing in the claims that follow unless limitations are expressly recited.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A method of making a filter assembly, the method comprising:
    disposing an electrically conductive input member on a substrate;
    disposing an electrically conductive output member on the substrate;
    disposing a plurality of band filters on the substrate, wherein each band filter is structured to pass or stop oscillatory electrical signals in a respective frequency band;
    disposing a plurality of connections on the substrate in one-to-one correspondence with the band filters, wherein the connections are structured such that every connection is disposed in an electrically non-conductive open configuration or such that every connection is disposed in an electrically conductive closed configuration; and
    structurally modifying at least one of the connections from the electrically open configuration to the electrically closed configuration or from the electrically closed configuration to the electrically open configuration,
    wherein, at least upon structurally modifying at least one of the connections, a transmission path for oscillatory electrical signals is defined between the input member and the output member, through which transmission path oscillatory electrical signals in at least one said frequency band is attenuated or blocked from passing from the input member to the output member.

2. The method of claim 1, wherein structurally modifying at least one of the connections comprises disposing an electrical jumper across a gap defined by a particular connection such that, by disposing the electrical jumper, the particular connection is structurally modified from the electrically open configuration to the electrically closed configuration.

3. The method of claim 2, wherein disposing an electrical jumper across a gap comprises disposing electrically conductive material across the gap by at least one of chemical vapor deposition, sputtering, epitaxial growth, solder reflowing, and placement of an electrically conductive member.

4. The method of claim 1, wherein structurally modifying at least one of the connections comprises removing an electrical jumper from a particular connection such that, by removing the electrical jumper, a gap is defined and the particular connection is structurally modified from the electrically closed configuration to the electrically open configuration.

5. The method of claim 4, wherein removing an electrical jumper comprises at least one of mechanical material removal, chemical etching, ablating the jumper, burning the jumper, melting the jumper, applying radiation, applying ultraviolet radiation, applying laser radiation, applying electrical current, applying electrical voltage, and applying heat.

6. The method of claim 1, wherein disposing a plurality of connections on the substrate in one-to-one correspondence with the band filters comprises disposing a plurality of switches in one-to-one correspondence with the band filters, and wherein structurally modifying at least one of the connections comprises switching at least one of the switches from the electrically open configuration to the electrically closed configuration or from the electrically closed configuration to the electrically open configuration.

7. The method of claim 1, wherein disposing a plurality of band filters on the substrate comprises disposing a plurality of band-pass filters on the substrate or disposing a plurality of band-stop filters on the substrate.

8. The method of claim 1, wherein disposing a plurality of band filters on the substrate comprises disposing at least one surface acoustic wave (SAW) filter on the substrate.

9. The method of claim 1, wherein disposing a plurality of band filters on the substrate comprises disposing at least one micro-electromechanical system (MEMS) device on the substrate.

10. A method of modifying a filter assembly, the method comprising:
    providing a filter assembly that includes at least:
    a substrate;
    an electrically conductive input member disposed on the substrate;
    an electrically conductive output member disposed on the substrate;
    a plurality of band filters disposed on the substrate, wherein each band filter is structured to pass or stop oscillatory electrical signals in a respective frequency band; and
    a plurality of connections disposed on the substrate in one-to-one correspondence with the band filters, wherein the connections are structured such that every connection is disposed in an electrically non-conductive open configuration or such that every connection is disposed in an electrically conductive closed configuration,
    the method further comprising structurally modifying at least one of the connections from the electrically open configuration to the electrically closed configuration or from the electrically closed configuration to the electrically open configuration, wherein, at least upon structurally modifying at least one of the connections, a transmission path for oscillatory electrical signals is defined between the input member and the output member, through which transmission path oscillatory electrical signals in at least one said frequency band is attenuated or blocked from passing from the input member to the output member.

11. The method of claim 10, wherein structurally modifying at least one of the connections comprises disposing an electrical jumper across a gap defined by a particular connection such that, by disposing the electrical jumper, the particular connection is structurally modified from the electrically open configuration to the electrically closed configuration.

12. The method of claim 11, wherein disposing an electrical jumper across a gap comprises disposing electrically conductive material across the gap by at least one of chemical vapor deposition, sputtering, epitaxial growth, solder reflowing, and placement of an electrically conductive member.

13. The method of claim 10, wherein structurally modifying at least one of the connections comprises removing an electrical jumper from a particular connection such that, by removing the electrical jumper, a gap is defined and the particular connection is structurally modified from the electrically closed configuration to the electrically open configuration.

14. The method of claim 13, wherein removing an electrical jumper comprises at least one of mechanical material removal, chemical etching, ablating the jumper, burning the jumper, melting the jumper, applying radiation, applying ultraviolet radiation, applying laser radiation, applying electrical current, applying electrical voltage, and applying heat.

15. The method of claim 10, wherein the plurality of connections disposed on the substrate in one-to-one correspondence with the band filters comprises a plurality of switches in one-to-one correspondence with the band filters, and wherein structurally modifying at least one of the connections comprises switching at least one of the switches from the electrically open configuration to the electrically closed configuration or from the electrically closed configuration to the electrically open configuration.

16. The method of claim 10, wherein the plurality of band filters disposed on the substrate comprises a plurality of band-pass filters or a plurality of band-stop filters.

17. The method of claim 10, wherein the plurality of band filters disposed on the substrate comprises a surface acoustic wave (SAW) filter or a micro-electromechanical system (MEMS) device.

* * * * *